US009276545B2

United States Patent
Chan et al.

(10) Patent No.: US 9,276,545 B2
(45) Date of Patent: *Mar. 1, 2016

(54) METHOD OF POWER AMPLIFIER SWITCHING POWER CONTROL USING POST POWER AMPLIFIER POWER DETECTION

(71) Applicant: BlackBerry Limited, Waterloo (CA)

(72) Inventors: Wen-Yen Chan, Thornhill (CA); Nasserullah Khan, Waterloo (CA); Ian Ka Yin Chung, Toronto (CA); Hamza Mohaimeen Bari, Ottawa (CA)

(73) Assignee: BLACKBERRY LIMITED, Waterloo (CA)

( * ) Notice: Subject to any disclaimer, the term of this patent is extended or adjusted under 35 U.S.C. 154(b) by 6 days.

This patent is subject to a terminal disclaimer.

(21) Appl. No.: 14/076,311

(22) Filed: Nov. 11, 2013

(65) Prior Publication Data

US 2014/0065990 A1    Mar. 6, 2014

Related U.S. Application Data

(63) Continuation of application No. 12/842,126, filed on Jul. 23, 2010, now Pat. No. 8,620,238.

(51) Int. Cl.
*H04W 52/08* (2009.01)
*H04B 1/04* (2006.01)
(Continued)

(52) U.S. Cl.
CPC ............. *H03G 11/00* (2013.01); *H03G 3/3042* (2013.01); *H04B 1/04* (2013.01); *H04B 2001/045* (2013.01); *H04B 2001/0416* (2013.01)

(58) Field of Classification Search
USPC .................................. 455/126, 127.1, 127.2
See application file for complete search history.

(56) References Cited

U.S. PATENT DOCUMENTS

| 3,486,128 A | 12/1969 | Lohrmann |
| 4,453,264 A | 6/1984 | Hochstein |

(Continued)

FOREIGN PATENT DOCUMENTS

| AU | 2007260547 | 12/2007 |
| AU | 2007260548 | 12/2007 |

(Continued)

OTHER PUBLICATIONS

Canadian Office Action for Canadian Patent Application No. 2,745,491, dated Sep. 12, 2013.

(Continued)

*Primary Examiner* — Blane J Jackson
(74) *Attorney, Agent, or Firm* — Perry + Currier Inc.

(57) ABSTRACT

Various embodiments described herein relate to a power management block and one or more amplification blocks used in the transmitter of a communication subsystem. The power management block provides improved control for the gain control signal provided to a pre-amplifier and the supply voltage provided to a power amplifier, both of which are included in a selected one of the amplification blocks. The power expended by the power amplifier is optimized by employing a continuous control method in which one or more feedback loops are employed to take into account various characteristics of the transmitter components and control values. Post power amplifier transmission power is detected for input into the one or more feedback loops executed in the power management block. A controller for the power amplifier is design to stabilize the system with respect to gain expansion in the power amplifier.

20 Claims, 8 Drawing Sheets

(51) Int. Cl.
*H03G 11/00* (2006.01)
*H03G 3/30* (2006.01)

(56) References Cited

U.S. PATENT DOCUMENTS

| | | |
|---|---|---|
| 4,809,339 A | 2/1989 | Shih et al. |
| 4,849,711 A | 7/1989 | Leis et al. |
| 5,192,919 A | 3/1993 | Wieczorek |
| 5,267,262 A | 11/1993 | Wheatley, III |
| 5,452,473 A | 9/1995 | Weiland et al. |
| 5,467,058 A | 11/1995 | Fujita |
| 5,485,486 A | 1/1996 | Gilhousen et al. |
| 5,732,334 A | 3/1998 | Miyake |
| 5,852,630 A | 12/1998 | Langberg et al. |
| 6,043,707 A | 3/2000 | Budnik |
| 6,064,269 A | 5/2000 | Ruppel et al. |
| 6,107,878 A | 8/2000 | Black |
| 6,137,840 A | 10/2000 | Tiedemann, Jr. et al. |
| 6,166,598 A | 12/2000 | Schlueter |
| 6,178,313 B1 | 1/2001 | Mages et al. |
| 6,205,127 B1 | 3/2001 | Ramesh |
| 6,208,202 B1 | 3/2001 | Kaufman et al. |
| 6,252,455 B1 | 6/2001 | Kurby et al. |
| 6,265,935 B1 | 7/2001 | Kaneda et al. |
| 6,313,698 B1 | 11/2001 | Zhang et al. |
| 6,349,216 B1 | 2/2002 | Alberth et al. |
| 6,359,504 B1 | 3/2002 | Cozzarelli |
| 6,373,823 B1 | 4/2002 | Chen et al. |
| 6,421,327 B1 | 7/2002 | Lundby et al. |
| 6,445,247 B1 | 9/2002 | Walker |
| 6,525,605 B2 | 2/2003 | Hu et al. |
| 6,531,860 B1 | 3/2003 | Zhou et al. |
| 6,535,066 B1 | 3/2003 | Petsko |
| 6,566,944 B1 | 5/2003 | Pehlke et al. |
| 6,597,925 B1 | 7/2003 | Garcia et al. |
| 6,765,440 B2 | 7/2004 | Chandrasekaran |
| 6,862,457 B1 | 3/2005 | Sarkar et al. |
| 6,871,050 B2 | 3/2005 | Wahl |
| 6,876,697 B2 | 4/2005 | Peters et al. |
| 6,891,902 B2 | 5/2005 | Talwar et al. |
| 6,898,257 B2 | 5/2005 | Fischer et al. |
| 6,914,487 B1 | 7/2005 | Doyle et al. |
| 6,965,676 B1 | 11/2005 | Allred |
| 6,985,704 B2 | 1/2006 | Yang et al. |
| 7,023,897 B2 | 4/2006 | Kurihara |
| 7,116,955 B2 | 10/2006 | Schaffer et al. |
| 7,183,856 B2 | 2/2007 | Miki et al. |
| 7,333,563 B2 | 2/2008 | Chan et al. |
| 7,375,540 B2 | 5/2008 | Burns et al. |
| 7,411,896 B1 | 8/2008 | Karsi |
| 7,471,738 B2 | 12/2008 | Chan et al. |
| 7,542,741 B2 | 6/2009 | Rozenblit et al. |
| 7,551,689 B2 | 6/2009 | Chan et al. |
| 7,787,566 B2 | 8/2010 | Chan et al. |
| 7,852,968 B2 | 12/2010 | Chan et al. |
| 7,873,119 B2 | 1/2011 | Chan et al. |
| 7,877,566 B2 | 1/2011 | Adusumilli |
| 7,907,920 B2 | 3/2011 | Chan et al. |
| 8,000,409 B2 | 8/2011 | Chan et al. |
| 8,098,761 B2 | 1/2012 | Chan et al. |
| 8,160,517 B2 | 4/2012 | Chan et al. |
| 8,290,085 B2 | 10/2012 | Chan et al. |
| 8,295,397 B2 | 10/2012 | Chan et al. |
| 8,295,792 B2 | 10/2012 | Chan et al. |
| 8,428,181 B2 | 4/2013 | Chan et al. |
| 8,599,963 B2 | 12/2013 | Chan et al. |
| 8,606,199 B2 | 12/2013 | Chan et al. |
| 8,620,238 B2 | 12/2013 | Chan et al. |
| 8,670,503 B2 | 3/2014 | Chan et al. |
| 8,761,305 B2 | 6/2014 | Chan et al. |
| 2001/0026600 A1 | 10/2001 | Mochizuki et al. |
| 2001/0048292 A1 | 12/2001 | Wahl |
| 2002/0013157 A1 | 1/2002 | Ichikawa |
| 2002/0080887 A1 | 6/2002 | Jeong et al. |
| 2002/0159503 A1 | 10/2002 | Ramachandran |
| 2002/0183028 A1 | 12/2002 | Takahashi et al. |
| 2003/0002452 A1 | 1/2003 | Sahota |
| 2003/0036361 A1 | 2/2003 | Kawai et al. |
| 2003/0060193 A1 | 3/2003 | Kurita |
| 2003/0086398 A1 | 5/2003 | Hiltunen |
| 2003/0176202 A1 | 9/2003 | Bartl et al. |
| 2003/0222819 A1 | 12/2003 | Karr et al. |
| 2004/0100921 A1 | 5/2004 | Khan |
| 2004/0146013 A1 | 7/2004 | Song et al. |
| 2004/0180686 A1 | 9/2004 | Nakayama |
| 2004/0208260 A1 | 10/2004 | Chan et al. |
| 2004/0213335 A1 | 10/2004 | Forest et al. |
| 2004/0251962 A1 | 12/2004 | Rosnell et al. |
| 2005/0122171 A1 | 6/2005 | Miki et al. |
| 2005/0186923 A1 | 8/2005 | Chan et al. |
| 2005/0285681 A1 | 12/2005 | Doherty et al. |
| 2006/0046658 A1 | 3/2006 | Cruz et al. |
| 2006/0046666 A1 | 3/2006 | Hara et al. |
| 2006/0140296 A1 | 6/2006 | Cleveland et al. |
| 2007/0035285 A1 | 2/2007 | Balakrishnan et al. |
| 2007/0115053 A1 | 5/2007 | Vaisanen |
| 2007/0139014 A1 | 6/2007 | Girson et al. |
| 2007/0184791 A1 | 8/2007 | Vinayak et al. |
| 2007/0258602 A1 | 11/2007 | Vepsalainen et al. |
| 2007/0291718 A1 | 12/2007 | Chan et al. |
| 2007/0291872 A1 | 12/2007 | Chan et al. |
| 2008/0118001 A1 | 5/2008 | Chan et al. |
| 2009/0021303 A1 | 1/2009 | Vinayak et al. |
| 2009/0074107 A1 | 3/2009 | Chan et al. |
| 2009/0245419 A1 | 10/2009 | Chan et al. |
| 2010/0227578 A1 | 9/2010 | Chan et al. |
| 2010/0233978 A1 | 9/2010 | Chan et al. |
| 2010/0283626 A1 | 11/2010 | Breed |
| 2010/0291887 A1 | 11/2010 | Chan et al. |
| 2011/0053533 A1 | 3/2011 | Chan et al. |
| 2011/0130105 A1 | 6/2011 | Chan et al. |
| 2011/0319124 A1 | 12/2011 | Chan et al. |
| 2012/0021704 A1 | 1/2012 | Chan et al. |
| 2012/0087441 A1 | 4/2012 | Chan et al. |
| 2012/0122411 A1 | 5/2012 | Chan et al. |
| 2012/0329411 A1 | 12/2012 | Chan et al. |
| 2013/0005286 A1 | 1/2013 | Chan et al. |
| 2013/0012147 A1 | 1/2013 | Chan et al. |
| 2013/0149978 A9 | 6/2013 | Chan et al. |
| 2013/0273863 A1 | 10/2013 | Chan et al. |

FOREIGN PATENT DOCUMENTS

| | | |
|---|---|---|
| CA | 2506512 | 6/2004 |
| CA | 2497038 | 8/2005 |
| CA | 2616323 | 12/2007 |
| CA | 2623941 | 12/2007 |
| CA | 2740489 | 11/2011 |
| CA | 2745491 A1 | 1/2012 |
| CN | 1525658 | 9/2001 |
| CN | 1153388 | 10/2001 |
| CN | 1329413 | 1/2002 |
| CN | 1355967 | 6/2002 |
| CN | 101341653 | 11/2010 |
| CN | 1658497 | 7/2011 |
| CN | 101341654 | 11/2011 |
| CN | 102255620 | 11/2011 |
| DE | 10002523 | 8/2001 |
| DE | 602004000811 | 10/2006 |
| EP | 0171843 | 2/1986 |
| EP | 0977354 | 2/2000 |
| EP | 1146636 | 10/2001 |
| EP | 1441472 | 7/2004 |
| EP | 1569330 | 5/2006 |
| EP | 1569359 | 5/2007 |
| EP | 1568151 | 8/2007 |
| EP | 2027650 | 2/2009 |
| EP | 2027651 | 2/2009 |
| EP | 2388914 | 11/2011 |
| EP | 2410655 | 1/2012 |
| JP | 06132736 | 5/1994 |
| JP | 1994069002 | 8/1994 |
| JP | 06252797 | 9/1994 |
| JP | 774551 | 3/1995 |

(56) References Cited

FOREIGN PATENT DOCUMENTS

| | | |
|---|---|---|
| JP | 1155041 | 2/1999 |
| JP | 2001237722 | 8/2001 |
| JP | 2001284998 | 10/2001 |
| JP | 2004500775 | 1/2004 |
| JP | 2004048797 | 2/2004 |
| JP | 2005197870 | 7/2005 |
| JP | 2005244996 | 9/2005 |
| JP | 2009505459 | 2/2009 |
| JP | 2011229179 | 11/2011 |
| JP | 4922299 | 4/2012 |
| JP | 5185115 | 6/2013 |
| KR | 1020050013782 | 2/2005 |
| KR | 1020080036078 | 4/2008 |
| KR | 101010042 | 1/2011 |
| WO | 0077950 | 12/2000 |
| WO | 0167617 | 9/2001 |
| WO | 0233844 | 4/2002 |
| WO | 02060088 | 8/2002 |
| WO | 02076057 | 9/2002 |
| WO | 2004051843 | 6/2004 |
| WO | 2005053151 | 6/2005 |
| WO | 2007054609 | 5/2007 |
| WO | WO 2007/054609 * 5/2007 | ............. H04B 7/005 |
| WO | 2007143843 | 12/2007 |
| WO | 2007143844 | 12/2007 |

OTHER PUBLICATIONS

Canadian Office Action for Canadian Patent Application No. 2,745,491, dated Sep. 20, 2012.
European Response for European Patent Application No. 10170714.9, dated Nov. 12, 2013.
European Exam Report for European Patent Application No. 10170714.9, dated Jul. 15, 2013.
European Response for European Patent Application No. 10170714.9, dated Jul. 5, 2013.
European Exam Report for European Patent Application No. 10170714.9, dated Mar. 14, 2013.
European Response for European Patent Application No. 10170714.9, dated Feb. 26, 2013.
European Exam Report for European Patent Application No. 10170714.9, dated Oct. 19, 2012.
European Response for European Patent Application No. 10170714.9, dated Oct. 4, 2012.
European Exam Report for European Patent Application No. 10170714.9, dated Aug. 10, 2012.
US 6,560,446, 5/2003, Ramchandran (withdrawn).
United States Notice of Allowance for U.S. Appl. No. 13/611,914, dated Sep. 5, 2013.
United States Response for U.S. Appl. No. 13/611,914, dated Aug. 20, 2013.
United States Office Action for U.S. Appl. No. 13/611,914, dated May 21, 2013.
Prosecution documents for U.S. Appl. No. 12/785,009.
Prosecution documents for U.S. Appl. No. 11/763,099.
United States Notice of Allowance for U.S. Appl. No. 13/604,202, dated Oct. 17, 2013.
United States Request for Continued Examination for U.S. Appl. No. 13/604,202, dated Oct. 1, 2013.
United States Notice of Allowance for U.S. Appl. No. 13/604,202, dated Jul. 1, 2013.
United States Response for U.S. Appl. No. 13/604,202, dated Jun. 13, 2013.
United States Office Action for U.S. Appl. No. 13/604,202, dated Mar. 13, 2013.
Prosecution documents for U.S. Appl. No. 13/193,589.
Prosecution documents for U.S. Appl. No. 12/847,612.
Prosecution documents for U.S. Appl. No. 12/478,812.
Prosecution documents for U.S. Appl. No. 12/025,247.
Prosecution documents for U.S. Appl. No. 10/781,812.
Prosecution documents for U.S. Appl. No. 10/724,951.
Prosecution documents for U.S. Appl. No. 12/276,650.
Prosecution documents for U.S. Appl. No. 12/942,757.
United States Notice of Allowance for U.S. Appl. No. 13/325,895, dated Aug. 8, 2013.
United States Response for U.S. Appl. No. 13/325,895, dated Jul. 16, 2013.
United States Office Action for U.S. Appl. No. 13/325,895, dated May 29, 2013.
United States Response for U.S. Appl. No. 13/325,895, dated Apr. 5, 2013.
United States Office Action for U.S. Appl. No. 13/325,895, dated Jan. 11, 2013.
United States Supplemental Response for U.S. Appl. No. 13/325,895, dated Dec. 12, 2012.
United States Response for U.S. Appl. No. 13/325,895, dated Dec. 3, 2012.
United States Office Action for U.S. Appl. No. 13/325,895, dated Sep. 28, 2012.
Prosecution documents for U.S. Appl. No. 12/784,932.
Prosecution documents for U.S. Appl. No. 12/842,126.
Prosecution documents for U.S. Appl. No. 11/763,068.
Prosecution documents for U.S. Appl. No. 12/784,971.
Prosecution documents for U.S. Appl. No. 13/351,328.
United States Notice of Allowance for U.S. Appl. No. 13/611,094, dated Oct. 30, 2013.
United States Request for Continued Examination for U.S. Appl. No. 13/611,094, dated Oct. 18, 2013.
United States Notice of Allowance for U.S. Appl. No. 13/611,094, dated Jul. 19, 2013.
United States Request for Continued Examination for U.S. Appl. No. 13/611,094, dated Jun. 25, 2013.
United States Notice of Allowance for U.S. Appl. No. 13/611,094, dated Apr. 17, 2013.
United States Response for U.S. Appl. No. 13/611,094, dated Apr. 5, 2013.
United States Office Action for U.S. Appl. No. 13/611,094, dated Jan. 7, 2013.
Maksimovic, D. et al., "60% Efficient 10-GHz Power Amplifier with Dynamic Drain Bias Control", IEEE Transactions on Microwave Theory and Techniques, IEEE Service Center, Piscataway, NJ, US, vol. 52, No. 3, Mar. 1, 2004, pp. 1077-1081.
Larson et al., "Device and Circuit Appraoches for Improved Wireless Communications Transmitters", Oct. 1, 1999, IEEE Personal Communications, IEEE Communications Society, University of California, San Diego, pp. 18-23.
Document relating to CA Application No. 2,745,491, dated Jan. 28, 2014 (Response).
Document relating to U.S. Appl. No. 13/829,569, dated Dec. 26, 2013 (Office Action).
Document relating to U.S. Appl. No. 13/611,914, dated Dec. 3, 2013 (RCE).
Document relating to U.S. Appl. No. 13/611,914, dated Jan. 7, 2014 (Notice of Allowance).
Document relating to U.S. Appl. No. 13/829,569, dated Mar. 26, 2014 (Response).
Document relating to EP Application No. 10170714.9, dated Apr. 10, 2014 (Communication under Rule 71(3) EPC / Intent to Grant).
Document relating to U.S. Appl. No. 13/829,569, dated Apr. 2, 2014 (Supplemental Terminal Disclaimer).
Document relating to U.S. Appl. No. 13/829,569, dated Apr. 3, 2014 (Terminal Disclaimer review decision).
Document relating to U.S. Appl. No. 13/829,569, dated Apr. 9, 2014 (Terminal Disclaimer and decision).
Document relating to U.S. Appl. No. 13/611,914, dated Apr. 7, 2014 (Notice of Allowance).
Document relating to U.S. Appl. No. 13/611,914, dated May 22, 2014 (Notice of Allowance).

(56) References Cited

OTHER PUBLICATIONS

Document relating to U.S. Appl. No. 13/829,569, dated Jun. 20, 2014 (Notice of Allowance).

Document relating to CA Application No. 2,745,491, dated Jul. 14, 2014 (Notice of Allowance).

Document relating to EP Application No. 10170714.9, dated Aug. 6, 2014 (Reply to Communication under Rule 71(3) EPC / Intent to Grant).

Document relating to EP Application No. 10170714.9, dated Aug. 21, 2014 (Decision to Grant).

* cited by examiner

METHOD OF POWER AMPLIFIER SWITCHING POWER CONTROL USING POST POWER AMPLIFIER POWER DETECTION

CROSS-REFERENCE TO RELATED APPLICATION

This application is a continuation of U.S. patent application Ser. No. 12/842,126, filed Jul. 23, 2010. The entire contents of U.S. patent application Ser. No. 12/842,126 are hereby incorporated by reference.

FIELD

Embodiments described herein relate generally to wireless communications devices and more particularly to improved operation with switch regulated power amplifier modules.

BACKGROUND

Handheld wireless communication devices can be powered by one or more internal batteries. A major performance criterion for such devices is their battery life, and a large portion of battery power is consumed in one or more power amplification blocks of the device's transmitter. In many handheld wireless applications, a switched mode power supply, which provides the supply voltage to a power amplifier in the power amplification block, along with a switching regulator, is used to reduce overall power consumption. However, this requires careful control of the switched mode power supply to achieve optimal power savings. Many conventional designs use a fixed-step, or continuous control technique for controlling the switched mode power supply because of the associated power efficiency savings.

BRIEF DESCRIPTION OF THE FIGURES

For a better understanding of the embodiments described herein, and to show more clearly how they may be carried into effect, reference will be made, by way of example only, to the accompanying drawings, in which.

DETAILED DESCRIPTION

Figure 1:
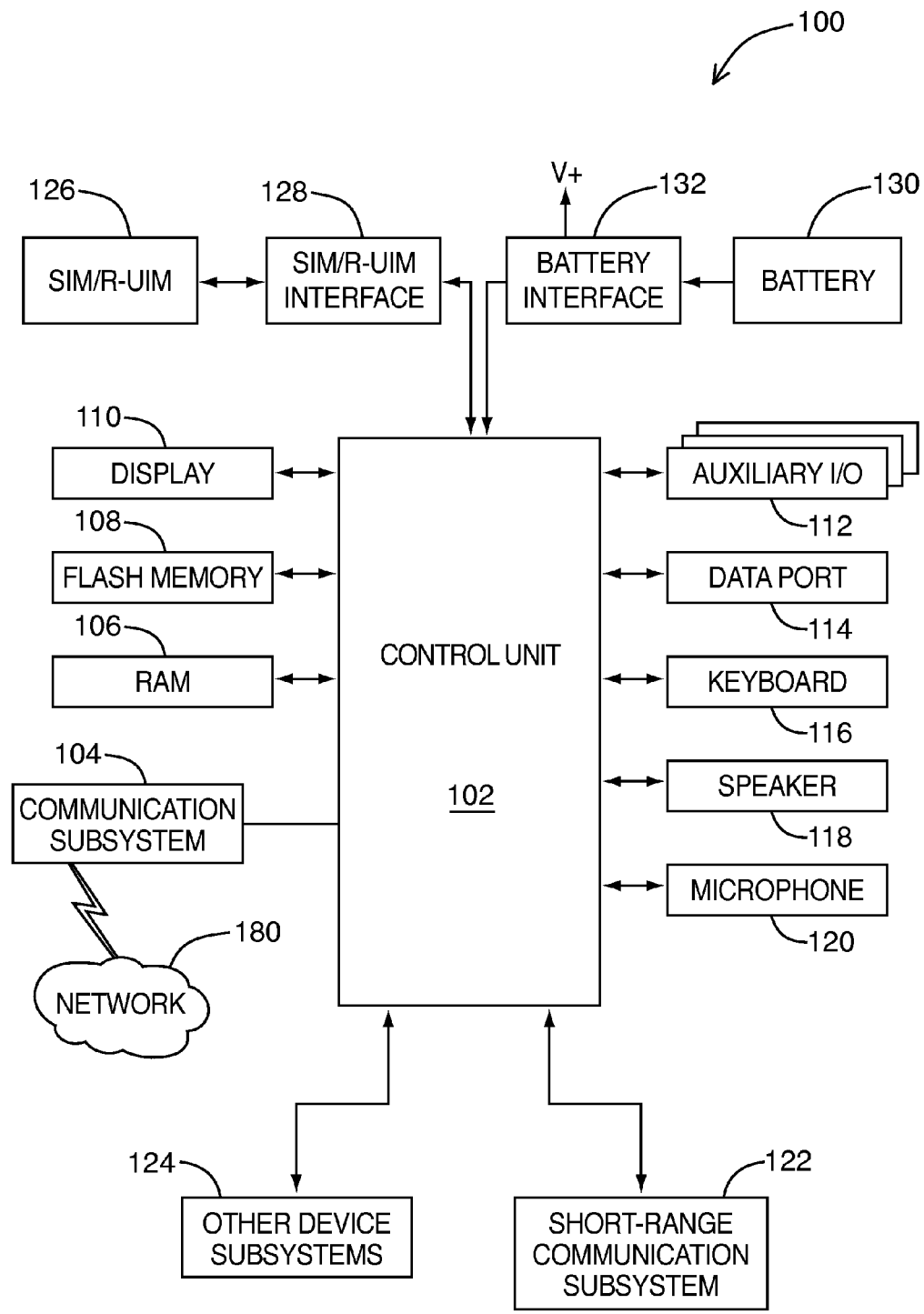
FIG. 1 is a block diagram of a mobile device in accordance with at least one embodiment.

It will be appreciated that for simplicity and clarity of illustration, where considered appropriate, reference numerals may be repeated among the figures to indicate corresponding or analogous elements. In addition, certain specific details may be included to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein, but rather as merely describing the implementation of various example embodiments described herein.

The described embodiments relate generally to a mobile device with a switch regulated power amplifier module for improved power efficiency. In mobile device transmitters, one or more power amplifiers can represent a large drain on available power, which can substantially shorten battery life in the case where the mobile device is battery-powered. Multiple power amplifiers can be included in the power amplifier module, for example, if the mobile device operates on multiple different transmission bands. Rather than use a single power amplifier for all such transmission bands, in accordance with at least one embodiments described herein, each transmission band can be allocated its own power amplifier in a corresponding transmission chain optimized for use with that band, thereby further increasing the efficiency of the power amplifier module. More efficient operation of the power amplifier module will ease corresponding requirements on the battery and permit generally longer battery life.

One approach to providing more efficient power amplification involves active control over the supply voltage provided to the one or more power amplifiers. Amplified transmission signals often have large peak to average power ratios so that the instantaneous power of the amplifier transmission signal will often be somewhat less than its maximum transmit power. More efficient operation of the power amplifier module can be achieved by actively controlling the bias point of a given power amplifier to maintain a minimum acceptable amount of headroom above the amplified transmission signal, as opposed to fixing the amplifier bias point at a level large enough to accommodate the maximum transmit power. Excess headroom is dissipated as heat. Both open loop and closed loop control schemes can be used to set the supply voltage. Different closed loop control schemes are also possible depending on where in the transmission chain of the output data signal power detection is performed.

The power amplifier control loop created when transmission power is detected on the input side of the power amplifiers is inherently stable, which can simplify controller design. However, if the mobile device transmitter operates using multiple power amplifiers, a separate coupler in each different transmission chain and associated with a different power amplifier will as a result often be used to perform power detection. As mentioned above, a multi-band transmitter may have a different power amplifier included in each transmission chain optimized for a different transmission band. A separate detector paired with each coupler could then be used as well, resulting in multiple detectors as well as multiple couplers in the transmitter. Alternatively, the multiple output couplers could be cascaded together (i.e., "daisy-chained") feeding a single detector so that at least only a single detector would be required. But in any event, the use of multiple couplers may still drive up cost and size requirements for the mobile device transmitter.

On the other hand, power detection performed at an appropriate location in the transmission chain on the output side of the power amplifiers can be accomplished, in some cases, using only a single coupler and a single detector. Even if the mobile device transmitter includes multiple power amplifiers, by multiplexing each respective transmission chain into a common link upstream of the power detection point, only a single coupler and detector on the common link would then be required. Often, in multi-mode wireless devices, a suitable switch will already be included at the feed to the transmitter antenna. A single coupler and detector located at the antenna feed could then make use of the existing switch to perform power detection, without having to add an additional switch for that purpose. In other cases, however, multiple couplers could still be used to perform post power-amplifier detection. If transmit power were to be detected directly on the output of a given power amplifier, before the different transmission chains were multiplexed together into a common link, then a single coupler would again likely be inadequate.

Detecting transmission power at an antenna feed can also provide a short and fairly direct path between the antenna and any control or pre-drive elements included in the power amplifier control loop. Some gain variable elements can then be removed from the power amplifier control loop that might otherwise be included if power detection were performed at some other location in the transmission chain. By not having to compensate for these additional gain variable elements, the feedback control can be somewhat simplified. Detecting transmission power at the antenna feed can also allow reflected power to be monitored with the addition of an extra detector for that purpose, allowing for more precise control of beam-steered antenna topologies.

However, post-power amplifier power detection can cause an inherent instability in the resulting power amplifier control loop. Many power amplifiers experience gain expansion during a voltage ramp, which could cause positive feedback in the power amplifier control loop and thus the inherent instability. High quality power amplifiers exhibiting little to no gain expansion can tend to be expensive. Thus, where post power amplifier power detection is employed, it is often necessary to design a loop-stable controller. Locating the coupler at the antenna feed, where there is often little to no signal filtering, can also introduce unwanted noise and harmonic distortion in the detector. Each of these two factors can result in a somewhat more complicated controller design. Moreover, using a single coupler for multiple transmission bands can also complicate design of the coupler, as it would then be required to operate over a larger relative bandwidth while at the same time maintaining good directivity. Locating the detector near the antenna can also generate interference from incoming signals received from the antenna.

Certain embodiments described herein relate to a transmitter for a mobile device comprising: a power amplifier for generating an amplified transmission signal; a detector coupled to an output of the power amplifier and configured to provide a detected amplified transmission signal; and a power management block comprising: a switching regulator control block configured to generate a switching supply control signal based on the detected amplified transmission signal; and a switched mode power supply coupled to the switching regulator control block and configured to generate a supply voltage signal for the power amplifier based on the switching supply control signal.

Certain embodiments described herein relate to a mobile device comprising: a processor configured to control the operation of the mobile device; a transmitter connected to the processor and configured to send and receive data, the transmitter comprising: a power amplifier for generating an amplified transmission signal; a detector coupled to an output of the power amplifier and configured to provide a detected amplified transmission signal; and a power management block comprising a switching regulator control block configured to generate a switching supply control signal based on the detected amplified transmission signal; and a switched mode power supply coupled to the switching regulator control block and configured to generate a supply voltage signal for the power amplifier based on the switching supply control signal.

In one broad aspect, the switching regulator control block can be configured to apply a switching control transfer function to the detected amplified transmission signal to generate the switching supply control signal. The switching control transfer function can be derived based on a characterization of the detector, control curves of the switched mode power supply, and a response of the power amplifier to input drive and supply voltage.

In another broad aspect, the switching regulator control block and the switched mode power supply can be included in a switching regulator control loop, and the switching control transfer function can have poles located to stabilize the switching regulator control loop for gain expansion in the power amplifier. The poles of the switching control transfer function can be further located to stabilize the switching regulator control loop for environmental or operating conditions of the power amplifier.

In another broad aspect, the switching regulator control block can be configured to generate the switching supply control signal having control values for the switched mode power supply that cause clipping of the amplified transmission signal.

In another broad aspect, the transmitter can also comprise a plurality of power amplifiers and at least one switch configured to couple one of the plurality of power amplifiers to the detector to provide the detected amplified transmission signal.

Certain embodiments described herein relate to a method of providing a supply voltage signal to a power amplifier. In one broad aspect, the method comprises: generating an amplified transmission signal using the power amplifier; detecting an output of the power amplifier to provide a detected amplified transmission signal; generating a switching supply control signal based on the detected amplified transmission signal; and generating the supply voltage signal by providing the switching supply control signal to a switched mode power supply.

In another broad aspect, the method can further comprise applying a switching control transfer function to the detected amplified transmission signal to generate the switching supply control signal. In another broad aspect, the method can further comprise deriving the switching control transfer function based on a characterization of the detector, control curves of the switched mode power supply, and a response of the power amplifier to input drive and supply voltage.

In another broad aspect, the method can further comprise deriving the switching control transfer function to have poles located to stabilize a switching regulator control loop for gain expansion in the power amplifier. In another broad aspect, the method can further comprise deriving the switching control transfer function to have poles located to stabilize the switching regulator control loop for environmental or operating conditions of the power amplifier.

In another broad aspect, the method can further comprise generating the switching supply control signal to have control values for the switched mode power supply that cause clipping of the amplified transmission signal.

In another broad aspect, the method can further comprise coupling one of a plurality of power amplifiers to the detector to provide the detected amplified transmission signal.

These and other aspects and embodiments are described in further detail below.

A wireless communications device is a two-way communications device with advanced data communication capabilities having the capability to communicate with other computer systems. The wireless communications device may also include the capability for voice communications. Depending on the functionality provided by the wireless communications device, it may be referred to as a data messaging device, a two-way pager, a cellular telephone with data messaging capabilities, a wireless Internet appliance, or a data communications device (with or without telephony capabilities). The wireless communications device communicates with other devices through a network of transceiver stations.

Referring first to FIG. 1, shown therein is a block diagram of an example embodiment of a wireless communications device 100 which may also be referred to as a mobile communications device. The wireless communications device 100 comprises a number of components, such as a control unit 102 which controls the overall operation of the wireless communications device 100. The control unit 102 may be a microprocessor or a microcontroller, for example.

Communication functions, including data and possibly voice communications, are performed through the communication subsystem 104. The communication subsystem 104 receives messages from and sends messages to a wireless network 180. In one embodiment, the communication subsystem 104 may be configured in accordance with CDMA2000 standards, or with Global System for Mobile Communication (GSM) and General Packet Radio Services (CPRS) standards. The GSM/GPRS wireless network is used worldwide and it is expected that these standards will eventually be superseded by the Enhanced Data GSM Environment (EDGE) and Universal Mobile Telecommunications Service (UMTS) standards. New standards are still being defined, but it is believed that they will have similarities to the network behaviour described herein, and it will also be understood that the device is intended to use any other suitable standards that are developed in the future. The wireless link connecting the communications subsystem 104 with the network 180 represents one or more different Radio Frequency (RF) channels, operating according to defined protocols specified for CDMA2000 or GSM/GPRS communications. With the network protocols, these channels are capable of supporting both circuit switched voice communications and packet switched data communications.

The control unit 102 also interacts with additional subsystems such as a Random Access Memory (RAM) 106, a flash memory 108, a display 110, an auxiliary input/output (I/O) subsystem 112, a data port 114, a keyboard 116, a speaker 118, a microphone 120, a short-range communications subsystem 122 and other device subsystems 124. Some of these components may be optional depending on the particular type of wireless communications device. Other types of non-volatile storage devices known in the art may be used rather than the flash memory 108. The keyboard 116 may be a telephone-type keypad, an alphanumeric keyboard or some other suitable keypad.

Some of the subsystems of the wireless communications device 100 perform communication-related functions, whereas other subsystems may provide "resident" or on-device functions. By way of example, the display 110 and the keyboard 116 may be used for both communication-related functions, such as entering a text message for transmission over the network 180, and device-resident functions such as a calculator or task list. Operating system software, and other various algorithms, used by the control unit 102 is typically stored in a persistent store such as the flash memory 108, which may alternatively be a read-only memory (ROM) or similar storage element (not shown). Those skilled in the art will appreciate that the operating system, specific device applications, or parts thereof, may be temporarily loaded into a volatile store such as the RAM 106.

The wireless communications device 100 may send and receive communication signals over the network 180 after required network registration or activation procedures have been completed. Network access is associated with a subscriber or user of the wireless communications device 100. To identify a subscriber, the wireless communications device 100 requires a Subscriber Identity Module or "SIM" card 126 or an R-UIM (Removable User Identity Module) to be inserted in a SIM interface 128 (or an R-UIM interface) in order to communicate with the network 180. The SIM card or R-UIM 126 is one type of a conventional "smart card" that is used to identify a subscriber of the wireless communications device 100 and to personalize the wireless communications device 100, among other things. Alternatively, user identification information can also be programmed into flash memory 108. Services may include, for example and without limitation: web browsing and messaging such as email, voice mail, Short Message Service (SMS), and Multimedia Messaging Services (MMS). More advanced services may include, for example and without limitation: point of sale, field service and sales force automation.

The wireless communications device 100 is a battery-powered device and includes a battery interface 132 for receiving one or more rechargeable batteries 130. The battery interface 132 is coupled to a regulator (not shown) which assists the battery 130 in providing supply power V+ to the wireless communications device 100. Although current technology makes use of a battery, future power source technologies such as micro fuel cells may provide the power to the wireless communications device 100. In some embodiments, wireless communications device 100 may be solar-powered.

The control unit 102, in addition to its operating system functions, enables execution of software applications on the wireless communications device 100. A set of applications which control basic device operations, including data and voice communication applications will normally be installed on the wireless communications device 100 during its manufacture. Another application that may be loaded onto the wireless communications device 100 may be a personal information manager (PIM). A PIM has the ability to organize and manage data items of interest to a subscriber, such as, but not limited to, e-mail, calendar events, voice mails, appointments, and task items. A PIM application has the ability to send and receive data items via the wireless network 180. In one embodiment, PIM data items are seamlessly integrated, synchronized, and updated via the wireless network 180 with the wireless communications device subscriber's corresponding data items stored and/or associated with a host computer system. This functionality creates a mirrored host computer on the wireless communications device 100 with respect to such items. This is especially advantageous where the host computer system is the wireless communications device subscriber's office computer system.

Additional applications may also be loaded onto the wireless communications device 100 through the network 180, the auxiliary I/O subsystem 112, the data port 114, the short-range communication subsystem 122, or any other suitable device subsystem 124. This flexibility in application installation increases the functionality of the wireless communications device 100 and may provide enhanced on-device functions, communication-related functions, or both. For example, secure communication applications may enable electronic commerce functions and other such financial transactions to be performed using the wireless communications device 100.

The data port 114 enables a subscriber to set preferences through an external device or software application and extends the capabilities of the mobile device 100 by providing for information or software downloads to the mobile device 100 other than through a wireless communication network. The alternate download path may, for example, be used to load an encryption key onto the mobile device 100 through a direct and thus reliable and trusted connection to provide secure device communication.

The short-range communication subsystem 122 provides for communication between the wireless communications device 100 and different systems or devices, without the use of the network 180. For example, the subsystem 122 may include an infrared device and associated circuits and components for short-range communication. Examples of short-range communication may include standards developed by the Infrared Data Association (IrDA), Bluetooth, and the 802.11 family of standards developed by IEEE.

In use, a received signal such as a text message, an e-mail message, or web page download will be processed by the communications subsystem 104 and input to the control unit 102. The control unit 102 will then process the received signal for output to the display 110 or alternatively to the auxiliary I/O subsystem 112. A subscriber may also compose data items, such as e-mail messages, for example, using the keyboard 116 in conjunction with display 110 and possibly auxiliary I/O subsystem 112. The auxiliary subsystem 112 may include devices such as: a touch screen, mouse, track ball, infrared fingerprint detector, or a roller wheel with dynamic button pressing capability. The keyboard 116 may be an alphanumeric keyboard and/or telephone-type keypad. A composed item may be transmitted over the network 180 through the communication subsystem 104.

For voice communications, the overall operation of the wireless communications device 100 is substantially similar, except that most of the received signals are output to the speaker 118, and most of the signals for transmission are transduced by microphone 120. Alternative voice or audio I/O subsystems, such as a voice message recording subsystem, may also be implemented on the wireless communications device 100. Although voice or audio signal output is accomplished primarily through the speaker 118, the display 110 may also be used to provide additional information such as the identity of a calling party, duration of a voice call, or other voice call related information.

Figure 2:
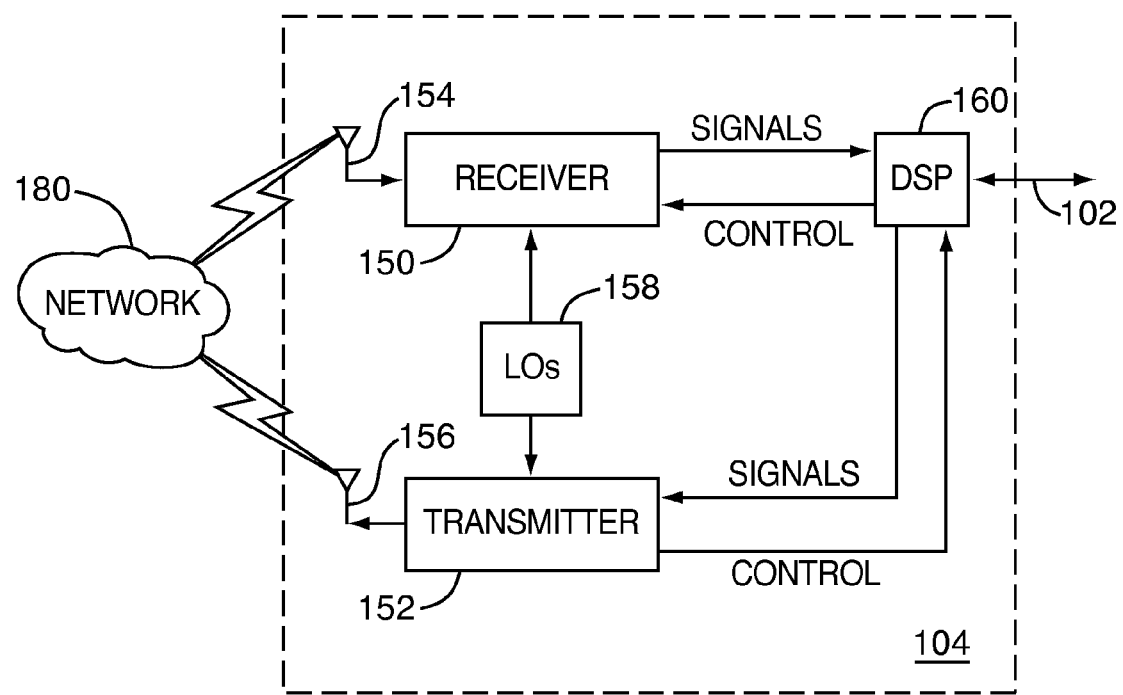
FIG. 2 is a block diagram of a communication subsystem component of the mobile device of FIG. 1.

Referring now to FIG. 2, a block diagram of the communication subsystem component 104 of FIG. 1 is shown. The communication subsystem 104 comprises a receiver 150, a transmitter 152, one or more embedded or internal antenna elements 154, 156, Local Oscillators (LOs) 158, and a processing module such as a Digital Signal Processor (DSP) 160.

The particular design of the communication subsystem 104 can depend upon the network 180 in which the mobile device 100 is intended to operate. Thus it should be understood that the design illustrated in FIG. 2 serves only as one example. Signals received by the antenna 154 through the network 180 are input to the receiver 150, which may perform such common receiver functions as signal amplification, frequency down conversion, filtering, channel selection, and analog-to-digital (A/D) conversion. Analog-to-digital conversion of a received signal allows more complex communication functions such as demodulation and decoding to be performed in the DSP 160. In a similar manner, signals to be transmitted are processed, including modulation and encoding, by the DSP 160. These DSP-processed signals are input to the transmitter 152 for digital-to-analog (D/A) conversion, frequency up conversion, filtering, amplification and transmission over the network 180 via the antenna 156. The DSP 160 not only processes communication signals, but also provides for receiver and transmitter control. For example, the gains applied to communication signals in the receiver 150 and transmitter 180 may be adaptively controlled through automatic gain control algorithms implemented in the DSP 160.

The wireless link between the mobile device 100 and the network 180 may contain one or more different channels, typically different RF channels, and associated protocols used between the mobile device 100 and the network 180. An RF channel is a limited resource that often must be conserved, typically due to limits in overall bandwidth of the mobile device 100.

When the mobile device 100 is fully operational, the transmitter 152 is typically keyed or turned on only when it is sending to the network 180 and is otherwise turned off to conserve resources. Similarly, the receiver 150 is periodically turned off to conserve power until it is needed to receive signals or information (if at all) during designated time periods.

The embodiments described herein relate also to a power management block that can be used in the transmitter 152 of the communication subsystem 104. The power management block is designed for improved management of the gain control signal provided to one or more pre-amplifiers, as well as the supply voltage signal supplied to one or more power amplifiers included in the transmitter 152. In at least one embodiment, the one or more pre-amplifiers and one or more power amplifiers are included in respective power amplification blocks of the transmitter 152, potentially in separate parallel transmission chains optimized for different transmission bands of the transmitter 152. The power expended by the one or more power amplifiers is optimized by employing a continuous control scheme in which at least one feedback loop is employed. As described herein, the feedback loop can take into account physical or other operational characteristics of certain components of the transmitter 152, such as the one or more pre-amplifiers and one or more power amplifiers, as well as various control signals generated in the feedback loop. When stabilized and operating properly, the feedback loop can modify an automatic gain control performed in the pre-amplifiers to linearize the relationship between the power of the amplified transmission signal and an automatic gain control (AGO) signal that is provided to the amplification block, as well as optimize the supply voltage signal supplied to the power amplifiers to minimize excess headroom and improve overall power amplifier efficiency.

Figure 3:
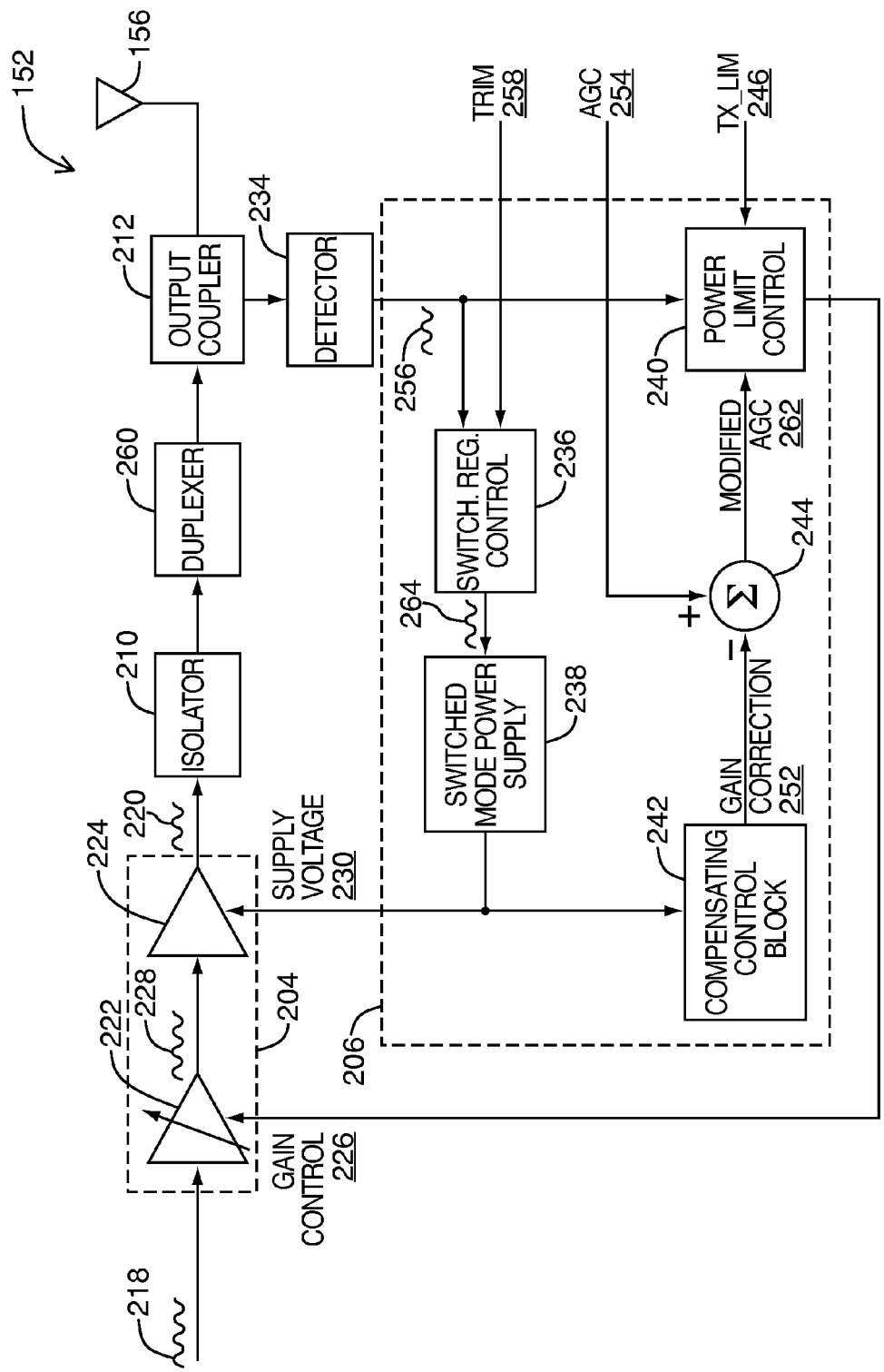
FIG. 3 is a block diagram of a portion of the transmitter of FIG. 2 having a power management block and a power amplification block in one embodiment.

Referring now to FIG. 3, shown therein is a block diagram of an embodiment of a portion of the transmitter 152 that can be used in the communications subsystem 104 of the wireless communications device 100. The transmitter 152 includes a power amplification block 204, a power management block 206, an optional isolator 210, and an output coupler 212. The output coupler 212 is connected at the input to the antenna 156 ("antenna feed") downstream of the duplexer 260. Though the receiver 150 is not explicitly illustrated in FIG. 3, the duplexer 260 can also be connected to the receiver 150. The output coupler 212 is also connected to a detector 234 for detecting post-amplifier transmission power. In some cases, isolator 210 can be interposed between the output of the power amplification block 204 and the input to the duplexer 260 for isolating the power amplification block 204 from other downstream components of the transmitter 152. In some cases, however, the isolator 210 can be excluded from the transmitter 152.

The wireless communications device 100 generates a data signal to be transmitted using the transmitter 152. The data signal is typically a comparatively low frequency signal that is generally referred to as a baseband signal. The baseband signal is processed by various components (not shown) of the communication subsystem 104 and mixed with a carrier signal having a substantially higher frequency to produce a transmission signal 218. In the transmitter 152, the transmission signal 218 is amplified by the power amplification block 204 to produce an amplified transmission signal 220, which is then sent through the isolator 210, the duplexer 260 and the output coupler 212 to be radiated by the antenna 156. As mentioned above, the isolator 210 protects the power amplification block 204 from reflections or other signal energy that is directed back upon the power amplification block 204. For example, if the isolator 210, output coupler 212, duplexer 260 and antenna 156 are not properly matched, some signal energy from the outgoing amplified transmission signal 220 may be reflected back upon the power amplification block 204. The power amplification block 204 is configured to provide a level of amplification for the amplified transmission signal 220 to have sufficient signal power to be received at a remote base station or other communication device with little or no data loss.

If the detector 234 were coupled to the input of the power amplifier 224 as opposed to the output, it may generally be possible to eliminate the isolator 210 and output coupler 212 from the transmitter 152. The isolator 210 and output coupler 212 could be removed in some cases since the reverse isolation of the power amplifier 224 would prevent reflected transmission power from reaching the detector 234. However, when the detector 234 is located at the output of the power amplifier 224, the isolator 210 and output coupler 212 may be required to prevent reflected transmission power from being sensed by the detector 234. Further, there would be power losses in the amplified transmission signal 220 due to the sampling done by the detector 234 if it was placed at the output of the power amplifier 224.

The power amplification block 204 includes a pre-amplifier 222 and a power amplifier 224. The pre-amplifier 222 is a variable gain amplifier and typically has a broad power spectrum. The pre-amplifier 222 produces a pre-amplified transmission signal 228, which is passed to the power amplifier 224. The gain of the pre-amplifier 222 is variable in order to provide a first amount of gain depending on the desired output power level for the amplified transmission signal 220. A gain control signal 226 can be generated and used to control the gain of the pre-amplifier 222 to achieve the desired gain. The power amplifier 224 then amplifies the pre-amplified transmission signal 228 to generate the amplified transmission signal 220, providing the remainder of the required gain as well as power amplification. The power amplifier 224 can be configured to provide a substantial gain, but typically will have a smaller power gain than the pre-amplifier 222. The power amplifier 224 may include one or multiple amplification stages. The power amplification block 204 is also shown in FIG. 3 explicitly including only one pre-amplifier 222 and power-amplifier 224. However, as will be discussed in more detail below with reference to FIG. 6, the power amplification block 204 may include multiple pre-amplifiers and multiple power amplifiers in variant embodiments.

A filter (not shown) may optionally be added after the pre-amplifier 222 for removing noise introduced into the pre-amplified transmission signal 228 by the pre-amplifier 222 or some prior stage of the wireless communications device 100. The filter parameters, such as passband frequency range or filter order, can be designed depending on the noise being filtered, for example.

Power management block 206 is included in the transmitter 152 for controlling one or more parameters of the power amplification block 204. In some embodiments, the power management block 206 includes a switching regulator control block 236, a switched mode power supply 238, a power limit control block 240, a compensating control block 242, and a summer 244. The power management block 206 can be divided into three subroutines: a power supply block (otherwise referred to as a switching regulator control loop), a compensating feedback loop, and a power limiting feedback loop. The switching regulator control loop includes the switching regulator control block 236 and the switched mode power supply 238, and receives the detected amplified transmission signal 256 and a trim signal 258 as inputs. The compensating feedback loop includes the components of the switching regulator control loop, as well as the compensating control block 242, the summer 244 and the power limit control block 240. The compensating feedback loop additionally receives an AGC signal 254 and a TX_lim control signal 246 as inputs. The power limiting feedback loop includes the power limit control block 240, and receives the detected amplified transmission signal 256, a modified AGO signal 262 (i.e. the AGC signal 254 adjusted by the gain correction signal 252 in the summer 244), and the TX_lim control signal 246. These various signals and blocks are discussed in more detail below.

It should also be noted that one or more of the power limit control block 240, the compensating control block 242, the summer 244 and the TX_lim control signal 246 are each optional in variant embodiments. For example, in some embodiments, the compensating control block 242 and summer 244 are omitted, in which case the AGC signal 254 (without adjustment by the gain correction signal 252) is provided directly to the power limit control block 240 instead of the modified AGC signal 262. In some embodiments, the power limit control block 240 is omitted, in which case the modified AGC signal 262 is provided directly to the pre-amplifier 222 as the gain control signal 226 without potential modification in the power limit control block 240. In some embodiments, each of the compensating control block 242, the summer 244 and the power limit control block 240 are omitted, in which case the power management block 206 includes only the switching regulator control loop, and the AGC signal 254 is provided directly to the pre-amplifier 222 as the gain control signal 226. In some embodiments, the AGC signal 254 may also not be directly accessible. Depending on the particular application, the power limit control loop and the compensating loop can operate substantially independently from each other. These loops are each discussed in further detail below.

During operation of the transmitter 152, the power amplifier 224 requires a supply voltage signal 230 with a magnitude that is sufficient so that the amplified transmission signal 220 can be produced with at most a maximum level of acceptable distortion. If the power amplifier 224 can be operated to have a constant level of acceptable distortion, then a fixed correction of the corresponding baseband data can be utilized to counteract later distortion introduced in the power amplifier 224 while saving power. Accordingly, when the power of the amplified transmission signal 220 falls within the transmitter's dynamic range, the power amplifier 224 should have constant headroom to ensure that the amplified transmission signal 220 is at most distorted in the same fashion.

One reason for significant power loss in the power amplification block 204 is that the amplified transmission signal 220 is generally not at the maximum level mentioned above and is usually at a lower power level. Often, this is caused by the amplified transmission signal 220 having a fairly large peak to average power ratio (PAPR). The excess headroom between the supply voltage signal 230 provided to the power amplifier 224 and the magnitude of the amplified transmission signal 220 is dissipated as heat. To avoid this potentially very large power loss and provide more efficient operation of the power amplifier 224, the switching regulator control block 236 can control the switched mode power supply 238 to generate the supply voltage signal 230 for the power amplifier 224 based on the output power levels in the power amplifier 224. According to the control mechanism, the magnitude of the supply voltage signal 230 is varied in response to variations in the output power in order to ensure a small, yet sufficient, amount of headroom in the power amplifier 224, thereby producing the amplified transmission signal 220 with acceptable distortion. The switching regulator control block 236 and the switched mode power supply 238 can be included in the power supply block.

A trim signal 258 is provided to the power management block 206 by the control unit 102. The trim signal 258 is a control signal used to remove unit-to-unit variation during factory calibration of the wireless communications device 100. The variation can be due, for example, to offsets caused by part variation for the components used to build the transmitter 152 and the feedback/control Loops. The trim signal 258 reduces (i.e. trims) variations caused by these offsets/ tolerances. This can be done by sampling the output of the switched mode power supply 238 during operation and adjusting the value for the trim signal 258 to obtain acceptable performance. In addition, the compression artifacts of the transmitter 152 can be measured and the value of the trim signal 258 adjusted until the desired amount of distortion is observed. The trim signal 258 can be optional in some designs depending on the tolerance stackup of the transmitter components. The trim signal 258 can also be generated using hardware components, software components, or a combination of hardware and software components.

The detector 234 is connected to the output coupler 212 to sense the amplified transmission signal 230 generated by the power amplifier 224 and produce a detected amplified transmission output signal 256. In some embodiments, the detector 234 can be an approximation to a true root mean square (RMS) detector with a linear scaled output. However, other types of detectors having other forms of output (e.g. a log output) can also be utilized for the detector 234. In some embodiments, non-RMS detectors can also be used for the detector 234. Whatever type of detector is used, its response (i.e., input-output transfer characteristic) can be ascertained and modeled, for example through offline testing of the detector 234, as explained in greater detail below. The response of the detector 234 can then be used in the feedback control loops for increased accuracy and to achieve loop stability.

The location of the detector 234 at a location in the outgoing transmission chain downstream of the power amplifier 224 creates an inherent instability in the switching regulator control loop due to gain expansion of the power amplifier 224. Gain expansion is a phenomenon observable in some power amplifier topologies where amplifier gain exhibits a dependence on the amplifier bias point (e.g. supply voltage or quiescent current) during voltage ramp. In other words, the amplifier gain can expand with increasing supply voltage or current bias, when ideally the amplifier gain would be invariant to ramping of the amplifier bias point. The causal relationship between gain and bias point makes the power amplifier 234, and thereby the entire switching regulator control loop, non-linear and non-time invariant (in the sense that the power amplifier 234 will exhibit a different response at different times depending on its initial bias conditions). Gain expansion in the power amplifier 224 can also cause the switching regulator control loop to have natural right-hand poles. Such control loops are inherently unstable.

Intuitively, when the detector 234 is located at the output of the power amplifier 224, increases in output power sensed by the detector 234 are fed back into the switching regulator control block 236, which responds by requesting the switched mode power supply 238 to produce a corresponding increase in the supply voltage signal 230 in order to maintain sufficient headroom in the power amplifier 224. However, ramping of the supply voltage signal 230 can cause the gain of the power amplifier 224 to expand and thereby further increase the detected output power. The process would then escalate until the control loop blows up completely and the power amplifier 224 completely saturates. Control loops exhibiting this characteristic are unstable because even small perturbations around an operating point can potentially destabilize the system and cause blowup. Thus, not just a step increase in the input drive of the power amplifier 224, but potentially even random noise appearing at the output of the power amplifier 224, could cause blowup and amplifier saturation.

Loop instability can be avoided by shifting the detector 234 to the input of the power amplifier 224 so that the switching regulator control loop would operate based on detected power of the pre-amplified transmission signal 228. In this location, output transmission power is derived from pre-amplified transmission power rather than being detected directly by the detector at the output of the power amplifier 224. The switching regulator control loop then does not directly observe gain expansion in the power amplifier 224, nor as a result respond to the effects of gain expansion. Suppressing the effects of power amplifier gain expansion from the switching regulator control loop avoids the above-described inherent instability. Instead, the detector 234 would only sense variations in the transmission power of the pre-amplified signal 228, which is dictated directly by the AGC signal 254 controlling pre-amplifier gain. The resulting switching regulator control loop from using pre-amplifier power detection, which has no natural right-hand poles, is inherently stable.

Although detecting the pre-amplified transmission signal 228 as opposed to the amplified transmission signal 220 results in loop stability (and thus generally simpler and more robust control), for certain transmitter topologies there may also be associated tradeoffs. As mentioned, some transmitters can be designed to operate with multiple pre-amplifiers and power amplifiers for multi-band operation, as opposed to the single pre-amplifier 222 and power amplifier 224 illustrated in FIG. 3. In these transmitters, a separate coupler and, in some cases, a separate detector would need to be associated with each power amplifier 224 so that the pre-amplified transmission signal 228 could be sensed regardless of which transmission chain the transmission signal 218 is routed through. The cost and space requirements associated with multiple couplers and multiple detectors could be substantial. Component variance could also affect the accuracy of the switching regulator control loop because detector response is characterized and used in the control. Reverse power detection for tuning the antenna 156 may also already be enabled in the transmitter 152 by inclusion of an output coupler at the antenna feed, in which case no additional hardware would be required for post-amplifier power detection.

The transmitter 152 illustrated in FIG. 3 includes a single output coupler 212 connected to a single detector 234 downstream of the power amplifier 224. In FIG. 3, the output coupler 212 is shown located at the feed to the antenna 156, though other locations for the output coupler 212 are possible well. For example, the output coupler 212 could also be located interposed between the isolator 210 and the duplexer 260, as well as directly at the output port of the power amplifier 224 at the input of the isolator 210. As seen for example in FIG. 6, the output coupler 212 can also be located downstream of a switch (e.g. 272) used to multiplex multiple separate transmission chains into a common link for radiation by the antenna 156. In general, the output coupler 212 can be located at any point on the common link of the outgoing transmission chains, so that only a single output coupler 212 and detector 234 would be required even if multiple power amplifiers are included in the transmitter 152.

Selection of a suitable output coupler 212 for use with the detector 234 can be based upon such parameters as the type of power amplifier 224, tuning of the various control blocks in the power management block 206, and intended overall performance targets for the power management block 206. Still other operational or environmental parameters can also be taken into account. In particular, but without limitation, the output coupler 212 can be a directional coupler. However, a resistive tap could also be used if the power amplifier 224 has sufficient reverse isolation, either naturally or in association with the isolator 210.

The detected amplified transmission signal 256 and the trim signal 258 are provided to the power management block 206 to improve the power efficiency of the power amplification block 204. This is accomplished by using these and other signals, as discussed below, to perform at least one of adjusting the gain of the pre-amplifier 222 and controlling the amplitude of the supply voltage signal 230 generated by the switched mode power supply 238. More specifically, the supply voltage signal 230 can be controlled for maintaining constant headroom in the power amplifier 224, while preserving overall loop stability despite gain expansion in the power amplifier 224. The gain control signal 226 can also be generated for adjusting the gain of the pre-amplifier 222 to compensate for the power amplifier gain expansion. The gain control signal 226 can also be regulated in order to anticipate and correct over power conditions in the power amplifier 224.

The switching regulator control block 236 controls the switched mode power supply 238 with a power supply control signal 264, which can be a continuous signal, a pulse width modulated signal, a pulse density modulated signal, or some other type of control. The switched mode power supply 238 is controlled to provide the supply voltage signal 230 in an optimal fashion based on the trim signal 258 and the detected amplified transmission signal 256. The supply voltage signal 230 is the source of power for the power amplifier 224. In addition, in some implementations, it may be desirable to use a filter at the output of the switched mode power supply 238 to filter certain high frequency noise components from the supply voltage signal 230 that result from switch controlled power generation.

The switching regulator control block 236 implements a controller that generates control values for the switched mode power supply 238. These control values can be encoded into the power supply control signal 264 and are calculated to cause the supply voltage signal 230 to be generated by the switched mode power supply 238 at the correct magnitude. Depending on the type of switched mode power supply 238 included in the power management block 206, the switching regulator control block 236 can be designed for a different controller. Various control devices are associated with different switched mode power supplies to control their output. For example, but without limitation, the switched mode power supply 238 can be a DC-DC switch converter, a voltage regulator, and the like. However, a broad class of devices may be utilized as the switched mode power supply 238 as long as the output voltage, current, efficiency and noise requirements of the power amplification block 204 are met.

In some embodiments, the switching regulator control block 236 can apply a switching control transfer function to the detected amplified transmission signal 256 to generate the power supply control signal 264 so that the switched mode power supply 238 is provided with the correct control values to generate the supply voltage signal 230. The switching control transfer function can be realized with hardware by using a properly designed filter corresponding to the transfer function parameters. A small offset may also be incorporated into the filter to account for minimum voltage requirements in the transmitter system components, which do not necessarily operate properly at 0 volts. Filter design can proceed by taking the desired time response of the switching control transfer function, applying the Laplace transform to the time response to extract the poles and zeroes of the switching control transfer function, then synthesizing the filter using appropriate hardware components to realize the calculated poles and zeros.

Alternatively, the switching control transfer function can also be realized using software components in place of, or potentially in addition to, hardware components. For example, the switching control transfer function can be implemented on a programmable processing device, such as a microprocessor or microcontroller, Central Processing Unit (CPU), Digital Signal Processor (DSP), Field Programmable Gate Array (FPGA), general purpose processor, and the like. The programmable processing device can be coupled to program memory, which stores instructions used to program the programmable processing device to execute the switching control transfer function. The program memory can include non-transitory storage media, both volatile and non-volatile, including but not limited to, random access memory (RAM), dynamic random access memory (DRAM), static random access memory (SRAM), read-only memory (ROM), programmable read-only memory (PROM), erasable programmable read-only memory (EPROM), electrically erasable programmable read-only memory (EEPROM), flash memory, magnetic media, and optical media. Other transmission type storage media can be used as well in variant embodiments.

To implement the switching control transfer function using software components, for example, a look-up table or array can be stored in the program memory, which explicitly defines the relationship between the input and output of the switching control transfer function. Thus, a set of output values can be determined and stored for a corresponding set of input values. During operation, the processor can translate a received input value into an output value by selecting the corresponding value in the look-up table. Optionally, the processor can also be configured to interpolate an output value where the received input falls between two of the stored data points. As another example software implementation, the processor can define an explicit equation or other mathematical relationship between the input and output of the switching control transfer function. Then during operation, the processor can compute the corresponding output value for a given input value. However, computing the output values during operation can represent a considerable drain on processing resources, as compared to pre-determining and storing output values in a look-up table.

Figure 4:
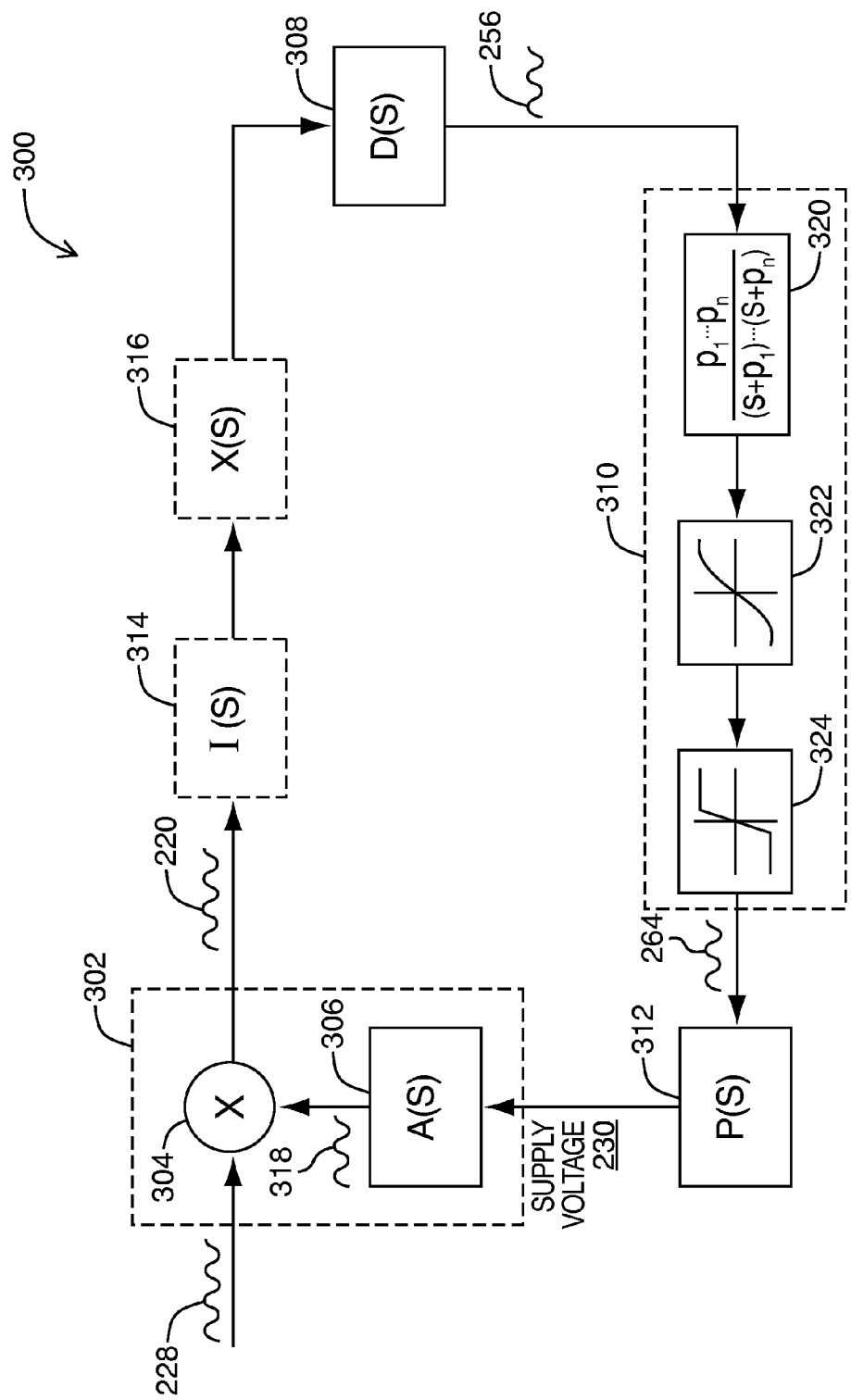
FIG. 4 is a block diagram of a portion of a switching regulator control loop in one embodiment, that can be used in the power management block of the transmitter of FIG. 3.

Referring now to FIG. 4, there is shown a schematic of a portion of the switching regulator control loop 300 in an example embodiment. A combination of plants (i.e., models of different system components) and control elements is illustrated in the switching regulator control loop 300. The switching regulator control loop includes power amplifier model 302 constructed out of multiplier 304 and gain expansion model 306. The switching regulator control loop also includes detector model 308, switching control transfer function 310, and switched mode power supply model 312. Optionally, for greater accuracy, other system components can be modeled and included in the switching regulator control loop 300. For example, optional isolator model 314 and duplexer model 316 can be included as well, though in some embodiments these can be omitted for simplicity of controller design.

The gain expansion model 304, detector model 308, switched mode power supply model 312, as well as other optional models, can be used in the switching regulator control loop 300 to simulate actual operating characteristics of the system components being modeled. The switching control transfer function 310, on the other hand, can be implemented using control elements or blocks (in hardware, software, or some combination of hardware and software) included in the switching regulator control loop 300 to effect a desired performance of the various system components. The different system components models can be developed, as will be explained in more detail below, through offline testing and can account for one or both of different transient and non-linear characteristics of the system components. After development of plant models, the control elements for the switching control transfer function 310 can be designed.

The pre-amplified transmission signal 228 is input into multiplier 304, which multiplies the pre-amplified transmission signal 228 by a gain factor 318 generated by gain expansion model 306 to reproduce the actual amplifier gain provided in power amplifier 224 (e.g., in FIG. 3). Multiplication of the pre-amplifier transmission signal 228 by the gain factor 318 generates the amplified transmission signal 220. Ideally, the gain factor 318 could be fixed and constant, but due to gain expansion during ramping of the power amplifier 224, the gain factor 318 is variable and dependent on the level of the supply voltage signal 230. The gain expansion model 306 can be used to generate the gain factor 318 based on the level of the supply voltage signal 230 by characterizing the response of the power amplifier 224 to variations in supply voltage. The gain expansion model 306, therefore, simulates the response of the actual power amplifier 224 in the switching regulator control loop 300 during operation of the transmitter 152 (e.g., in FIG. 3). The gain expansion model 306 can generally be non-linear and non-time invariant. The combination of the multiplier 304 and the gain expansion model 306 provides the power amplifier model 302.

The amplified transmission signal 220 is received into the detector model 308, optionally, after being transformed according to the isolator model 314 and the duplexer model 316. However, often the response of these two components of the transmitter 152 is not taken directly into account in design of the switching regulator control loop 300 for simplicity. The detector model 308 is used, similar to the gain expansion model 306, to characterize the actual response of the detector 234 during operation of the transmitter 152. The detector model 306 generates the detected amplified transmission signal 256, which is received as an input signal into the switching control transfer function 310.

The switching control transfer function 310, which can be implemented in the switching regulator control block 236, can comprise control elements designed to serve different functions in the switching regulator control loop 300. For example, switching control transfer function 310 can comprise one or more poles 320, power supply control curves 322 and, in some embodiments, rate limiter 324. The power supply control curves 322 represent a relationship between the magnitude of the detected amplified transmission signal 256 and the control values for the switched model power supply 238 required to generate the desired supply voltage signal 230. As mentioned above, the supply voltage signal 230 can be generated to provide some minimum headroom in the power amplifier 224 for efficient power amplification. The combination of the power supply control curves 322 and the switched model power supply model 312, which can be used to model various non-linearities of the switched mode power supply 238, can therefore represent an overall relationship between the magnitude of the detected amplified transmission signal 256 and the supply voltage signal 230.

The one or more poles 320 and optional rate limiter 324 can be used in the switching control transfer function 310 to affect the transient response of the supply voltage signal 230 to changes in the detected amplified transmission signal 256. For example, the one or more poles 320 can be placed so that the switching regulator control loop 300 is stabilized despite the effect of gain expansion in the power amplifier 224. Minimally, the one or more poles 320 can be placed so as to compensate all natural right-hand poles in the switching regulator control loop 300. Additionally, for robust operation, the one or more poles 320 can also be placed to provide adequate stability margins, e.g. gain margin, phase margin, or both. The one or more poles 320 can be located, for example, to provide adequate stability margins so that the switching regulator control loop 300 is stabilized, not just for gain expansion in the power amplifier 224, but also for operating and environment conditions of the transmitter 152 that can affect the performance of different systems components in the transmitter 152, such as the power amplifier 224 and the detector 234 (e.g. in FIG. 3). Factors such as temperature, channel voltage, and data rate can additionally influence the stability of the switching regulator control loop 300.

Rate limiter 324 can be included in the switching regulator control loop 300, for example, to introduce controlled clipping of the amplified transmission signal 220, while maintaining overall fast performance and good dynamic stability of the switching regulator control loop 300. By imposing an effective limit on the rate of change of the power supply control signal 264, the rate limiter 324 in turn places an effective limit on the rate at which the supply voltage signal 230 can change. Without the rate limiter 324, the rate of change of the supply voltage signal 230 would be limited by slewing and could generally track changes in the detected amplified transmission signal 256 with greater responsivity. However, that can also contribute to the instability of the switching regulator control loop 300 because the full effect of power amplifier gain expansion would be translated by the supply voltage transfer function 310 into increased supply voltage signal 230.

Rate limiting of the supply voltage signal 230 can add to the stability of the switching regulator control loop 300, in effect, by damping the response of the supply voltage signal 230 to increases in power in the detected amplified transmission signal 256. Rapid increases in the power of the detected amplified transmission signal 256 do not therefore cause such rapid ramping of the supply voltage signal 230 resulting in gain expansion and, eventually, runaway of the switching regulator control loop 300. The imposed rate limit can be selected to provide a trade off between the response time and overall stability of the switching regulator control loop 300. In some cases, if the amplified transmission signal 218 is ramped quickly enough, relative to the rate limit imposed on the supply voltage signal 230, the amplified transmission signal 230 may become temporarily clipped because the supply voltage signal 230 did not have enough time to adjust. However, the rate limiter 314 can be designed to provide a tradeoff between distortion in the amplified transmission signal 220 due to clipping and overall loop stability.

To design the switching control transfer function 310, the various system components included in the switching regulator control loop 300 can first be characterized. Once suitable models have been developed, control elements can be added to the switching control transfer function 310 to achieve suitable stability margins and transient response of the switching regulator control loop 300. The various system models can typically be developed before the control elements are designed because non-linear and non-time invariant (i.e., causal) effects in the power amplifier 224 can affect both the gain and phase margin of the switching regulator control loop 300. By subjecting the power amplifier 224 to offline testing, the required measurements to achieve suitable stability margins can be made.

In terms of designing the switching regulator control loop 300 for adequate phase margin, the gain response of the power amplifier 224 to variation in the supply voltage signal 230 can be measured under RF excitation. Accordingly, the supply voltage signal 230 can be swept over a range of amplitudes and the corresponding gain of the power amplifier 224 with respect to a test RF input signal can be measured and recorded. Similar measurements for the detector 234 can also be made to characterize the gain response of the detector 234 to variations in the supply voltage signal 230. For accurate measurements, transient and non-time invariant effects in the responses of the power amplifier 224 and detector 234 should be given adequate time to settle before the measurement is taken, otherwise these component responses may be improperly characterized. Some of these non-time invariant effects can have settles times on the order of seconds. Thus, conventional swept measurement techniques may yield spurious results by not affording the power amplifier 224 and the detector 234 enough time to reach a steady state.

Several different sets of measurements can also be made in order to set the phase margin of the switching regulator control loop 300. A first set of measurements that can be made is an assessment of the gain slopes associated with the quadratic nature of the detector response. A second set of measurements is an assessment of the gain slopes associated with the kinks in the gain curve of the power amplifier 234 as the supply voltage signal 230 is varied. More specifically, the power amplifier gain curve, though ideally linear, can have bends or kinks in response to variation of the supply voltage signal 230. These kinds can be characterized during testing of the power amplifier 224. A third set of measurements that can be made is a dynamic measurement to assess the time response of the non-time invariant effects associated with the power amplifier 224. These causal effects can introduce dynamic instabilities to the switching regulator control loop 300 by changing gain slopes associated with the power amplifier 234 and potentially also the detector 234 during rapid slews. Both fast and slow measurements can be made to measure these causal effects. A fourth set of measurements that can made is to test non-linear effects due to saturation, minimum gain (e.g., due to base bias) and slope changes in the power amplifier 224 that result from changes in the output impedance of the power amplifier 224 due to variation of the supply voltage signal 230. These measurements can be taken, for example, using a high power Vector Network Analyzer combined with a load puller.

The power supply control curves 322 can be defined by looking at several different output power levels for the power amplifier 224, and decreasing the supply voltage signal 230 for each of these levels until an acceptable minimum level of headroom is obtained for each power level. This provides a first relationship between the power level of the power amplifier 224 and the level of the supply voltage signal 230. The corresponding levels of the supply voltage signal 230 can then be related to the control values for the switched mode power supply 238 required to produce the given supply voltage signal 230. These two relations are then combined to define the power supply control curves 322 between the output of the detector 234 and the power supply control signal 264, which could be further related to the supply voltage signal 230 generated by the switched mode power supply 238, if desired.

Once the power amplifier model 302, detector model 308 and power supply control curves 322 have been suitably characterized, the control elements in the switching control transfer function 310 can be designed. The one or more poles 320 can be placed for loop stability and transient performance. For low order control systems of 3 poles or fewer, for example, the one or more poles 320 can be located by linearizing the switching regulator control loop 300 around its operating point. As noted above, the causal effects seen in the power amplifier 224 and detector 234 can result in the switching regulator control loop 300 being generally non-linear. If the order of the control system is low enough, linearization about its operating point may be an acceptable simplification.

If the switching regulator control loop 300 is a higher order system of more than 3 poles, the switching control transfer function 310 can be designed by considering the slowest pole first. Poles that are at least 10 times faster than the slowest pole can sometimes be ignored. Poles that are between 5 and 10 times faster can then be considered, but in some cases, these poles can be ignored as well. Alternatively, provided these poles are not unstable, zero placements can be used for partial compensation. However, because zero placements can increase system complexity and create production issues, zero placements can be used where there is some competing performance requirement. Slower poles, for example between 3 and 5 times faster than the slowest pole, can then be placed.

One approach to configuring the switching control transfer function 310 is to push the one or more poles 320 generally out to high frequency, so that a very wide phase margin is established. Because the low frequency gain expansion of the power amplifier 224 is generally difficult to eliminate, stability in the switching regulator control loop 300 can be maintained by ensuring a loop gain below unity, thereby ensuring adequate gain margin as well. Also, if the low frequency gain of the switching frequency control loop 300 is low enough, additional zeros (not shown) can be included in the switching control transfer function 310 to improve transient response. However, as mentioned, zero placements can increase overall design complexity and thus can be omitted in some cases.

Once the switching control transfer function 310 has been designed, its transient performance can be tested. Conventional step response and frequency response tests can be insufficient because the switching regulator control loop 300 is non-linear and non-time invariant. The transient behavior of the switching regulator control loop 300 can vary with the starting levels of the input step signal, as well as the previous history of the switching regulator control loop 300. Accordingly, testing the switching control transfer function 310 can involve stepping from various starting levels, which are selected so that the switching control transfer function 310 operates both below and above known gain slope discontinuities for each non-time invariant component in the switching regulator control loop 300, such as the power amplifier 224. Additionally, the tests can be performed at various different ramp rates to ensure that the temporal effects are properly characterized. If testing reveals any instabilities in the switching control transfer function 310, the process can be started again and a new switching control transfer function 310 can be designed and tested until the switching regulator control loop 300 has been stabilized for gain expansion in the power amplifier 224 and other operating and environment conditions.

Referring back to FIG. 3, continuous control schemes for the switching regulator control loop to control the amplitude of the supply voltage signal 230, without additional compensation or feedback, tend to introduce a non-linearity in the relationship between the gain of the pre-amplifier 222 and the output power of the power amplifier 224. More specifically, there is a non-linearity between the automatic gain control (AGC) signal 254, which controls pre-amplifier gain, and the power of the amplified transmission signal 220 produced by the power amplifier 224. Once again, this non-linearity is a result of gain expansion in the power amplifier 224 as the supply voltage signal 230 is varied, i.e. as the bias point of the power amplifier 224 is ramped. In typical transmitter designs, the input bias for the power amplifier 224 is internally generated. Additional power savings can be obtained by trimming the quiescent current if desired. The non-linear relationship between output power levels of the power amplifier 224 and gain in the pre-amplifier 222 makes calibration and temperature compensation difficult.

Accordingly, as described herein, the power management block 206 employs a compensating feedback loop to linearize the relationship between the AGC signal 254 and the power of the amplified transmission signal 220. The compensating feedback loop includes the compensating control block 242 and the summer 244. The compensating control block 242 is an estimator that samples the supply voltage signal 230 at the output of switched mode power supply 238 and translates the supply voltage signal 230 into a gain correction signal 252. The gain correction signal 252 is then subtracted from the AGC signal 254 via the summer 244 to produce a modified gain control signal 262. The compensating feedback loop acts to counteract the response of the power amplifier 224 to variation of the supply voltage signal 230.

A compensating transfer function can be used by the compensating control block 242 to translate a value for the supply voltage signal 230 to a value for the gain correction signal 252. First, the relationship between the gain and the supply voltage signal 230 for the power amplifier 224 is determined for several power amplifiers. Once an average relationship has been obtained, the inverse is computed taking into account some average characteristics of the pre-amplifier 222, such as the control slope of the pre-amplifier 222, to produce the compensating transfer function. By proper characterization of the power amplifier response to supply voltage variation, the compensating transfer function can effectively linearize the relationship between the gain and the supply voltage signal 230. One characteristic to consider is the average gain versus control voltage curve for the pre-amplifier 222. The thermal characteristics can be compensated at top power by matching the characteristics of the detector and transmitter chain. Alternatively, another design, which uses brute force software compensation, may be used that has compensation for temperature at all power levels.

Once the compensating transfer function is selected, the transient properties are examined by looking at the step response to make sure that it falls within acceptable limits. In designs which use the switching control transfer function, the compensating transfer function is often selected and tuned after the switching control transfer function has been selected and tuned. In designs which also use the power limiting transfer function, which is discussed below, the parameters for the power limit control block 240 are set high to not have an effect on selecting and tuning the compensating transfer function.

Similar to the switching control transfer function, the compensating transfer function may be implemented in software by a lookup table or mathematical equation, hardware using a hardware filter, or some combination of hardware and software components. When the compensating transfer function is realized via a lookup table, the supply voltage signal 230 and the rate of change of this signal is used to determine a value for the gain correction signal 252. The rate of change of the supply voltage signal 230 can be used to anticipate the state that the power amplifier 224 will be in next because it takes some time for the other circuits to adjust. In an alternative design, one could monitor the other bias parameters.

When the compensating transfer function is realized with a filter, the Laplace transform is applied to the time response or impulse response that corresponds to the compensating transfer function, and the filter is then synthesized based on the poles and zeros that are generated by the Laplace transform operation. The selection of the compensating transfer function allows for compensation not only of static gain changes but also dynamic variation due to lags in the control and power blocks. The compensating transfer function has a linear term and a first order derivative term.

The power limiting feedback loop of the power management block 206 is designed to anticipate and correct an overpower condition before it happens. The power limiting feedback loop includes the power limit control block 240 and the summer 244, and receives inputs from the detector 234 and the TX_lim control signal 246. Depending on whether the compensating control block 242 is included in the power management block 206, the power limit control block 240 can also receive the AGC signal 254 or the modified AGC signal 262 as an input. As described herein, it will be assumed that the modified AGC signal 262 is provided to the power limit control block 240. When the power limiting feedback loop is included in the power management block 206, the gain control signal 226 is set by the power limit control block 240 based on various inputs, and may be a power-limited version of the AGC signal 254 or modified AGC signal 262. The AGC signal 254 and the TX_lim control signal 246 are provided by the control unit 102. Alternatively, these signals can be provided by a processor in the communication subsystem 104, if one exists.

The TX_lim control signal 246 specifies the maximum allowable power of the output of the power amplifier 224. The TX_lim control signal 246 is a DC signal that is related to the operating frequency of the wireless communications device 100. When the operating frequency changes, the value of TX_lim control signal 248 changes in a corresponding fashion. The AGC signal 254 is modified, using summer 244, by the gain correction signal 252 generated by the compensating control block 242. The detector 234 senses the magnitude of the amplified transmission signal 220 and generates a corresponding detected amplified transmission signal 256, which is sent to the power limit control block 240. As mentioned above, the detected transmission signal 256 may not exactly equal the amplified transmission signal 220 and may depend on the transfer characteristics of the detector 234.

The power limit control block 240 monitors the detected amplified transmission signal 256 to determine when the magnitude of the amplified transmission signal 220 exceeds the magnitude of the TX_lim control signal 246. When that condition is met, the power limit control block 240 responds by adjusting the value of the modified AGC signal 262. The change in pre-amplifier gain correspondingly reduces the input drive to the power amplifier 224 to reduce the power of the amplified transmission signal 220. As described above, the modified AGC signal 262 is already gain-corrected by the output of the compensating control block 242 to linearize the output power of the power amplification block 204 with respect to the gain control signal 226. Separating the power limiting function from the compensating control function also decreases the accuracy requirements of the compensating control block 242.

Figure 5:
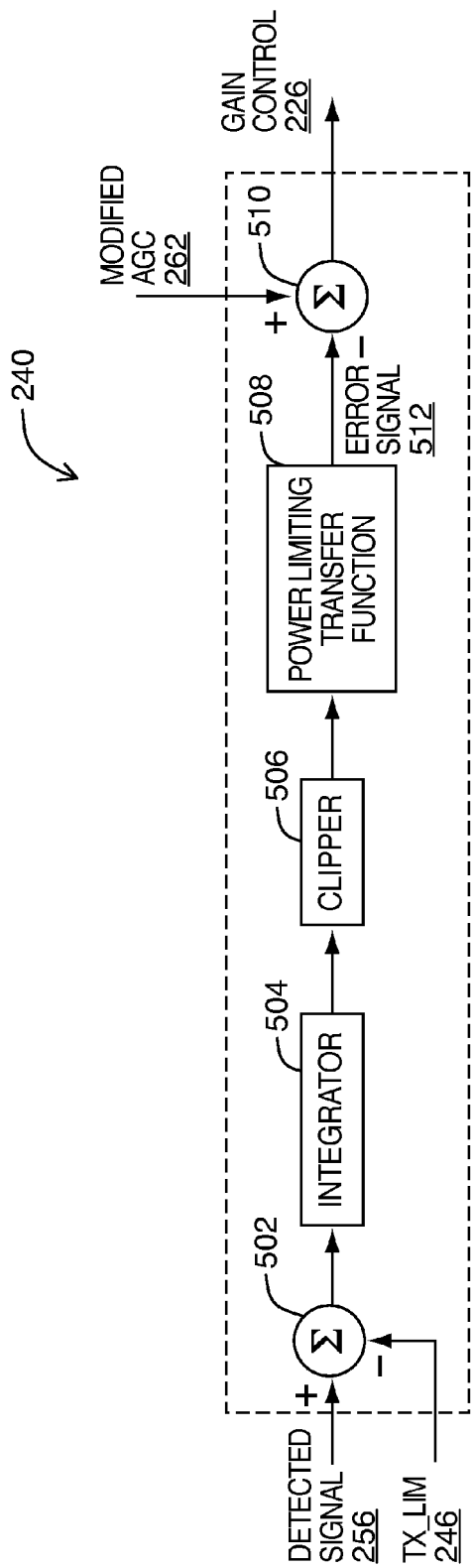
FIG. 5 is a block diagram of a power limit control block in one embodiment, that can be used in the power management block of the transmitter of FIG. 3.

Referring now to FIG. 5, there is shown an example embodiment of the power limit control block 240. The power limit control block 240 includes a summer 502, an integrator 504, a clipper 506, a power limiting transfer function 508, and a second summer 510. The power limit control block 240 can anticipate an over power condition before it occurs, and thereby provide an appropriate adjustment of the gain control signal 226 to prevent the over power condition from occurring or at least to reduce its effect. The power limit control block 240 operates based on the selected parameters for the power limiting transfer function 508, and by examining both a power error signal generated at the output of the summer 502, and a rate of change of the power error signal represented by the error signal 512, before generating a new value for the gain control signal 226. The rate of change of these signals is related to the rate of change of the output of the detector 234. If there is a high rate of change, there is likely to be an overshoot in the output power and an over power condition will result. If there is a low rate of change, the over power condition is less likely.

The power error signal is obtained when the summer 502 subtracts the TX_lim control signal 246 from the detected amplified transmission signal 256. The power error signal generated by the summer 502 can be passed sequentially through the integrator 504, the clipper 506, and the power limiting transfer function 508 to produce the error signal 512. The integrator 504 integrates the power error signal to provide an integrated power error signal, so that zero power residual error in the transmitted power can be achieved when the power limit control block 240 settles. The integrator 504 can be implemented in hardware, software, or some combination of hardware and software according to different techniques. For example, a low pass filter can be configured to operate as an integrator.

The clipper 506 receives the integrated power error signal and produces a clipped version of the integrated power error signal. The clipper 506 can be configured to convert negative input values to zero, while passing positive input values with an adjustment factor to account for a worst case AGC error. Accordingly, the output of the dipper 506 can be zero when the integrated power error signal is less than zero. Further, the output value of the dipper 506 can be equal to the amplitude of the integrated power error signal multiplied by an adjustment factor when the magnitude of the integrated power error signal is greater than zero. The adjustment factor is used for scaling purposes to compensate for the sensitivity of various components included in the transmitter 152. Without the clipper 506, the power limit control block 240 could force the transmitter 152 to run at maximum power irrespective of the value of the AGC signal 254.

In a variant embodiment, the relative locations of the integrator 504 and the clipper 506 can be reversed, so that the power error signal provided by the summer 502 is clipped first before integrating. With this ordering of the integrator 504 and clipper 506, the output of the clipper 506 would be zero when the amplitude of the TX_lim control signal 246 is larger than that of the detected amplified transmission signal 256. Moreover, the output of the clipper 506 would also equal the difference between the TX_lim control signal 246 and the detected amplified transmission signal 256 multiplied by the adjustment factor when the detected amplified transmission signal 256 is larger than the TX_lim control signal 246. However, by integrating the power error signal first before clipping, transmission power can recover quickly to a maximum requested power after undergoing power limiting. Manual resetting of the power limiting control loop can also be avoided in some cases by this particular ordering.

In one embodiment, the power limiting transfer function 508 has a linear term and a first order derivative term. The power limiting transfer function 508 processes the integrated power error signal to detect an over power condition before it occurs. During rapid ramp-up of the output power of the power amplification block 204, the switching regulator control loop, and in particular the switching regulator control block 236 and the switched mode power supply 238, may not respond quickly enough on its own. However, when a large rate of change of integrated error is detected, one can assume that the limit has been or will soon be exceeded and the output needs to be clamped extra quickly. This functionality is provided by various blocks in the power limit control block 240 including the power limiting transfer function 508. The power limit transfer function 508 is chosen to get the desired transient performance of the power limit control block 240 and can be selected based on prior knowledge of the different shaped power ramps to the control of the transmission power limit. The term "power ramp" refers to the relationship between power and time that is used to transition between different power levels. The knowledge of the expected shape allows for a more accurate design of the power limiting transfer function.

When the power limit TX_lim is exceeded, the error signal 512 is subtracted from the modified AGC signal 262 by the summer 510 to produce the gain control signal 226 to control the gain of the pre-amplifier 222. Alternatively, if the power limit TX_lim is not exceeded, the error signal 512 will be zero-valued and the gain control signal 226 will then simply equal the modified AGC signal 262. As mentioned, the modified AGC signal 262 is generated by subtracting the gain correction signal 252 from the AGC signal 254 in the summer 244.

The power limiting transfer function 508 can be generated using the following approach. Various different values for the detected amplified transmission signal 256 can be set in order to test various levels of over power with respect to the value of the TX_lim control signal 246. The parameters of the power limiting transfer function 508 can then be selected so that an error signal 512 is produced that adjusts the gain control signal 226 by an appropriate amount, resulting in an acceptable level of input drive provided by the output of the pre-amplifier 222. This sets the steady state characteristics of the power limiting transfer function 508. In other words, neglecting transient effects, the input-output characteristic between the detected amplified transmission signal 220 and the gain control signal 226 is defined.

The transient characteristics of the power limiting transfer function 508 are then observed by looking at the step response of the power limiting transfer function 508. The parameters of the power limiting transfer function 508 are then adjusted so that the overshoot and the settling time of the step response are acceptable. If all of the switching regulator control loop, the compensating loop, and the power limiting feedback loop are included in the transmitter 152, the switching control transfer function and the compensating transfer function are generally configured and tuned first before the power limiting transfer function 508.

Accurate, data rate independent power limiting may be provided by the choice of the detector 234 and the way that the power limit control block 240 is tuned. As the peak to average power ratio changes, the observed output of the detector 234 varies if it is not a true RMS detector. The accuracy of the power limiting transfer function 508 can also depend on detecting true RMS power. Some true RMS detectors can be linear-in-power (i.e., output varies proportionally to input power) and other true RMS detectors can be linear-in-voltage (i.e., output varies proportionally to input voltage). With a linear-in-power RMS detector, the top part of the detector dynamic range can be more compressed relative to a linear-in-voltage RMS detector, so that fine control of the output power involves comparing increasingly smaller voltage differences. However, a linear-in-voltage true RMS detector can give a quadratic relationship with input power, resulting in greater expansion about a maximum power point in the dynamic range of the detector, and less fine control overall at that maximum power point. For linear-in-voltage true RMS detectors, the measurement can also be data rate independent.

As with the compensating transfer function and the switching control transfer function, the power limiting transfer function 508 can be implemented in hardware with a filter, or alternatively in software as a look-up table or explicit mathematical equation. For example software implementations, the response time of the transfer function can additionally depend on the guaranteed latency of the software used to do the computations/lookups. On a processor with many applications running concurrently, this can depend upon code efficiency and whether the operating system can provide guaranteed latencies when executing real time code. For software implementations of the transfer function, the analysis can be done using discrete time steps, which can be modeled as a zero order hold if the sampling rate of the discrete time system is comparable to data rate. An extra pole with a time constant slightly greater than the sampling time interval can be used. In some example implementations, this approximation can be made if the sampling rate is between about three to five times greater than data rate. In general, the timing of the components is adjusted to provide a best fit to the timing requirements that are stipulated by the standard and network providers. The value for one timing parameter may need to be traded off against the value for another timing parameter.

Figure 6:
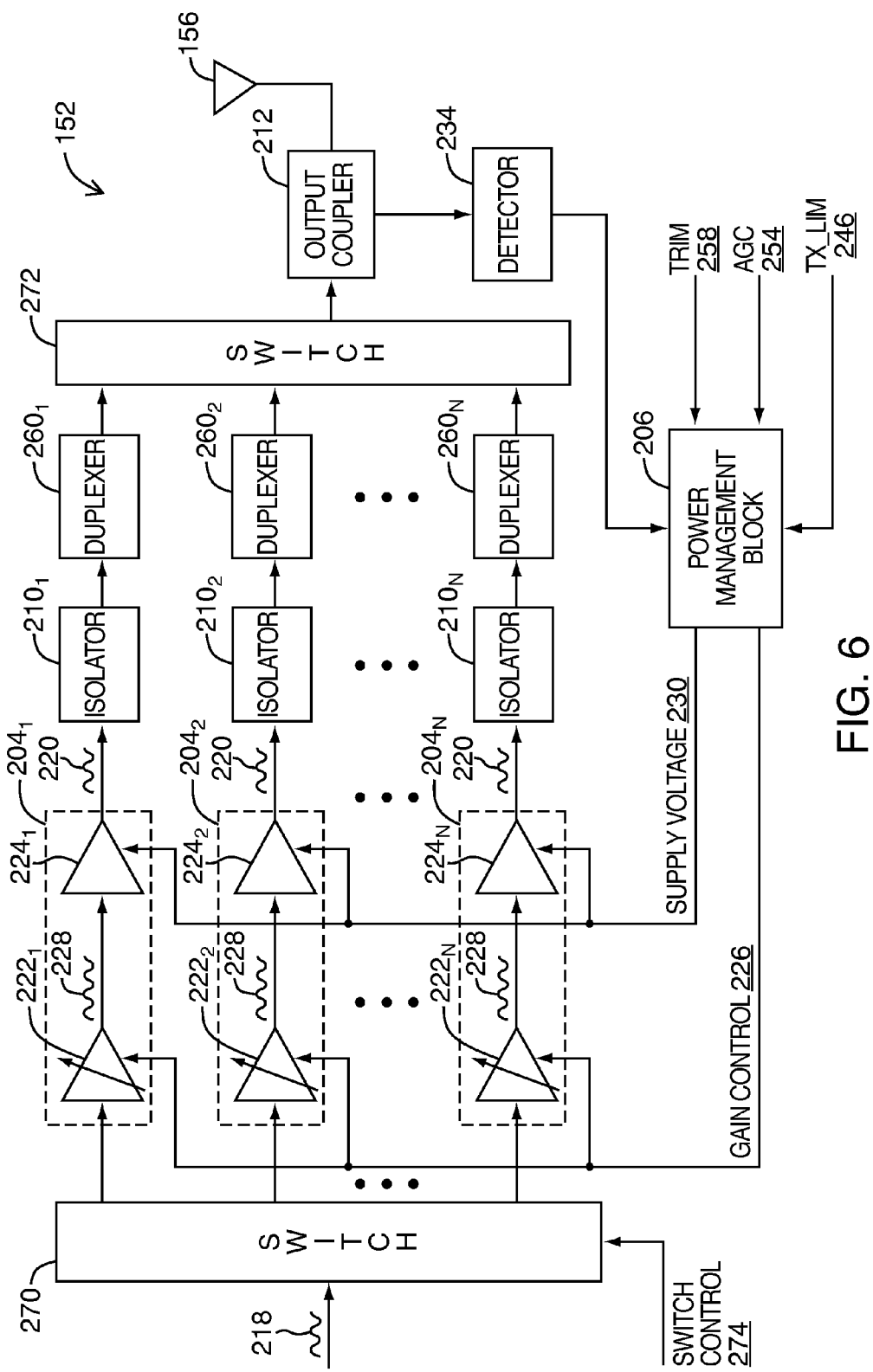
FIG. 6 is a block diagram of a portion of an alternative embodiment of the transmitter of FIG. 2 having a power management block and multiple power amplification blocks.

Referring now to FIG. 6, there is illustrated a portion of an alternative embodiment of the transmitter 152 illustrated in FIG. 3. The transmitter 152 shown in FIG. 6 is similar to the transmitter 152 illustrated in FIG. 3, but includes a plurality of power amplification blocks $204_{1-N}$, a plurality of isolators $210_{1-N}$, a plurality of duplexers $260_{1-N}$, input switch 270 and output switch 272. Each of the power amplification blocks $204_{1-N}$ can include a corresponding pre-amplifier and power amplifier so that the transmitter 152 comprises a plurality of pre-amplifiers $222_{1-N}$ and a plurality of power amplifiers $224_{1-N}$. Each of the power amplifiers $224_{1-N}$ can be optimized for a different transmission band used by the transmitter 152, and can be coupled with a corresponding one of the isolators $210_{1-N}$ and one of the duplexers $260_{1-N}$. Each of the isolators $210_{1-N}$ and duplexers $260_{1-N}$ can also be configured for narrow band operation, optimized for use with a given transmission band of the transmitter 152. In a variant embodiment, a single wideband duplexer could be located downstream of the output switch 272, although use of a wideband duplexer may incur a performance penalty.

The power amplification blocks $204_{1-N}$ and corresponding isolators $210_{1-N}$ and duplexers $260_{1-N}$ can be arranged in parallel between a controllable input switch 270 and an output switch 272. The input switch 270 receives the transmission signal 218 and, in response to a switch control signal 274, routes the transmission signal 218 to a corresponding one of the power amplification blocks $204_{1-N}$ for signal amplification. The selected power amplification block can depend on the transmission band currently being used by the transmitter 152. After amplification in one of the power amplification blocks $204_{1-N}$, the amplified transmission signal 220 is multiplexed into the output coupler 212 by the output switch 272. Similar to before, the isolators $210_{1-N}$ are optional and can be excluded from the transmitter 152, in some embodiments.

With this arrangement of input switch 270, output switch 272, and the plurality of power amplification blocks $204_{1-N}$, the transmitter 152 can collapse multiple parallel transmission chains onto a common link for post power amplifier power detection using only a single output coupler 212 and detector 234. However, in some embodiments, the input switch 270 can be excluded from the transmitter 152 and signal routing can be performed using the output switch 272 to select one of the parallel transmission chains to be coupled to the common link. As before, detector 234 can provide the detected amplification transmission signal 256 to the power management block 206 to implement one or more of the switching regulator control loop, compensating feedback loop, and power limit control loop, if needed, with appropriate modification to account for the multiple transmission chains. Also as before, different locations for the output coupler 212 on the common link could be possible, though it may be convenient to locate the output coupler 212 at the feed to the antenna 156, for example.

The supply voltage signal 230 and the gain control signal 226 generated by the power management block 206 can be provided to each of the power amplification blocks $204_{1-N}$ simultaneously through hard-wired connections as shown. Alternatively, an additional controllable switch (not shown) can be used to route one or both of the supply voltage signal 230 and the gain control signal to only the currently active power amplification block $204_{1-N}$. For example, the supply voltage signal 230 can be multiplexed into the plurality of power amplifiers $224_{1-N}$ if multiple power supply feeds are provided from different voltage nodes and there is inter-node leakage during operation. Either way, the supply voltage signal 230 and the gain control signal 226 are provided to whichever power amplification block $204_{1-N}$ they have been optimized for use with.

Figure 7:
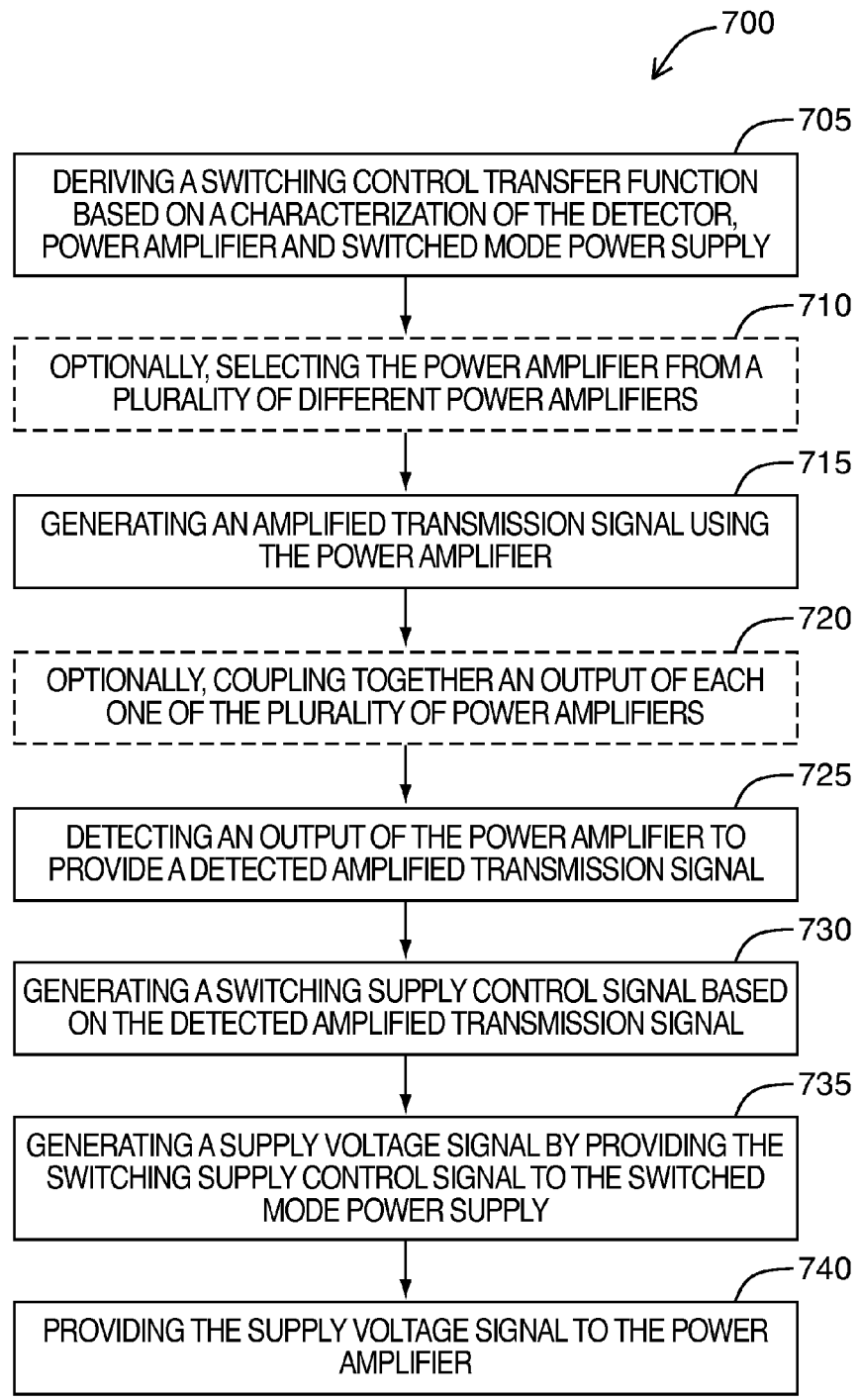
FIG. 7 shows a flowchart for a method of providing a supply voltage signal to a power amplifier, in accordance with at least one embodiment.

Referring now to FIG. 7, there are illustrated acts of a method 700 for providing a supply voltage signal to a power amplifier, in accordance with at least one embodiment. In one embodiment, the acts of the method 700 can be performed in conjunction with the transmitter 152 (FIG. 3), comprising the power amplifier 224, detector 234, and switched mode power supply 238. Alternatively, the acts of the method 700 can also be performed in conjunction with the transmitter 152 (FIG. 6), comprising the power amplifiers $224_{1-N}$. Some acts of the method 700 can be performed using hardware components, other acts of the method 700 can be performed using software components, and still other acts of the method 700 can be performed using either hardware or software components or some combination of the two. Further details of the method 700 can also be found at, for example, the description corresponding to FIGS. 3, 4 and 6.

At 705, a switching control transfer function is derived based on one or more parameters of the power amplifier, detector and switched mode power supply. For example, the switching control transfer function can be derived based on one or more of a characterization of the detector, control curves of the switched mode power supply, and a response of the power amplifier to input drive and supply voltage. The switching control transfer function can then be used at 730 in generating a switching supply control signal for the switched mode power supply, as will be explained more below.

Based on the one or more parameters of the amplifier, detector and switched mode power supply, the switching control transfer function can also be derived to have poles located to stabilize a switching regulator control loop that includes the detector and switched mode power supply. For example, the poles of the switching control transfer function can be located to stabilize the switching regulator control loop for gain expansion in the power amplifier due to bias point variation. Further, the poles can be located to stabilize the switching regulator control loop for operating and environmental conditions of the power amplifier. Additional details are provided below with reference to FIG. 8.

At 710, the power amplifier can optionally be selected from a plurality of different power amplifiers $224_{1-N}$ (FIG. 6). Alternatively, if only a single power amplifier 224 (FIG. 3) is included, then 710 can be omitted in some embodiments.

At 715, an amplified transmission signal is generated using the power amplifier. As mentioned above, depending on whether 710 is performed, the power amplifier 224 (FIG. 3) or one of the plurality of power amplifiers $224_{1-N}$ (FIG. 6) can be configured to generate the amplified transmission signal by amplifying a pre-amplified transmission signal provided by a pre-amplifier. The power amplifier can also be configured, in some cases, to generate the amplified transmission signal directly by amplifying a transmission signal.

At 720, optionally, the output of each of the plurality of different power amplifiers can be coupled together onto a common link, for example, in order to detect the amplified transmission signal using a common detector. As with 710, if only a single power amplifier 224 (FIG. 3) is included, then 720 can be omitted as well in some embodiments.

At 725, the output of the power amplifier is detected to provide a detected amplified transmission signal, which can represent the amplified transmission signal as detected by a detector. For example, the detector 234 (FIG. 3,6) can be used, regardless of the number of different power amplifiers included in the transmitter.

At 730, a switching supply control signal representing control values for the switched mode power supply can be generated based on the detected amplified transmission signal. For example, the switching regulator control block 236 (FIG. 3) can be configured to generate the switching supply control signal by applying the switching control transfer function derived at 705 to the detected amplified transmission signal generated at 725. The switching supply control signal can be also generated to have control values for the switched mode power supply that cause clipping of the amplified transmission signal at the output of the power amplifier. For example, a rate limiter can be included in the switching control transfer function to achieve amplifier clipping.

At 735, the supply voltage signal for the power amplifier can be generated by providing the switching supply control signal to the switched mode power supply, which generates the supply voltage signal in response to the received control values. As described herein, the supply voltage signal for the power amplifier can be generated, by performing the acts of the method 700, so that sufficient headroom is maintained in the power amplifier, while also stabilizing the power amplifier for gain expansion and other operating or environmental conditions. At 740, the supply voltage signal can be provided to the power amplifier by the switched mode power supply.

Figure 8:
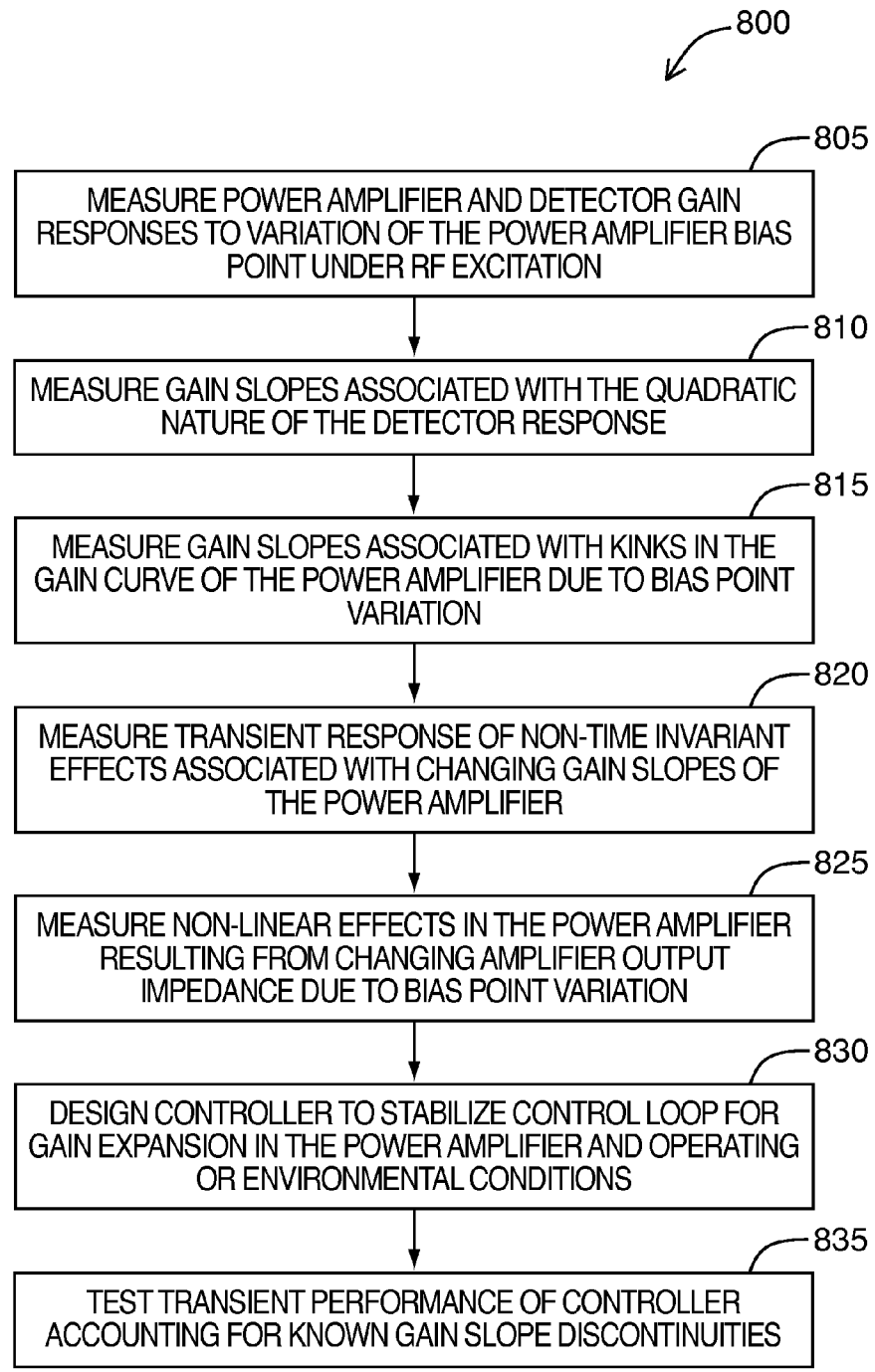
FIG. 8 shows a flowchart for a method of deriving a switching control transfer function for the switching regulator control loop of FIG. 4, in accordance with at least one embodiment.

Referring now to FIG. 8, there are illustrated acts of a method 800 for deriving a switching control transfer function for a switching regulator control loop, in accordance with at least one embodiment. The acts of the method 800 can be performed at 705 (FIG. 7) in at least one example implementation. Accordingly, the acts of the method 800 can also be performed in conjunction with the transmitter 152 (FIGS. 3 and 6), according to some embodiments. Further details of the method 800 can again be found at, for example, the description corresponding to FIGS. 3, 4 and 6.

At 805, the gain responses of a power amplifier and a detector due to variation of the amplifier bias point are measured. The gain responses can be measured at RF excitation, and after any transients or other non-time invariant effects have had sufficient time to settle. At 810, gain slopes associated with the quadratic nature of the detector response can be measured. At 815, gain slopes associated with kinks in the gain curve of the power amplifier due to bias point variation can be measured. At 820, the transient response of non-time invariant effects associated with changing gain slopes of the power amplifier can be measured. At 825, non-linear effects in the power amplifier resulting from changing amplifier output impedance due to bias point variation can be measured.

At 830, a suitable controller for the switching regulator control loop 300 (FIG. 4) can be designed based on the measurements taken at 805 through 825. These measurements can also be used, for example, to generate models for the power amplifier and detector 302 and 308 (FIG. 4) to facilitate design and testing. As described above with reference to FIG. 7, the controller can be designed having one or more poles located so as to stabilize the control loop for gain expansion in the power amplifier, and to provide adequate gain and phase margins for robust performance of the controller in a range of operating or environmental conditions.

At 835, the transient performance of the controller can be tested accounting for known gain slope discontinuities in the responses of the amplifier and detector. For example, the controller can be tested using a range of different step inputs having different starting levels selected so that the controller operates both above and below the known gain discontinuities, and further so that the controller is driven through the known gain discontinuities in both upward and downward directions.

Optionally, if testing of the controller at 835 reveals instabilities at certain operating levels of the controller, different acts of the method 800 can be performed again until a stable controller is designed. For example, one or more of the acts at 805 through 825 can be performed again to take new measurements of the amplifier and detector. Alternatively, or additionally, the act at 830 can be performed again to design a new controller based on the measurements. The transient performance of the re-designed controller can then be tested again at 835. Still other acts may be performed as part of the method 800.

Provided the resulting power control loops can be stabilized, the architecture of the power management block 206 along with the location of the detector 234 at the output of the multiple amplifiers can realize significant cost and bulk savings, relative to other possible power control schemes, by reducing the number of required couplers and detectors. Accurate, rate independent power limiting and linearization of the AGC curve versus transmission power for the amplification blocks $204_{1-N}$ may also be realizable. Moreover, the continuous control method used by the switching regulator control block 236 can result in better power savings and no phase discontinuities in the transmitted signal during a step change in the magnitude of the supply voltage signal 230.

Each transfer function implemented in the power management control block 206 is tuned in an appropriate manner related to its functionality, and the transfer functions used in the various blocks are different from one another. Also, careful tuning of the various loops may be performed if the transmitter 152 is to be used in situations in which the output power may change rapidly, such as during an access probe or a gated transmission.

The architecture of the power management block 204 helps decrease calibration time by removing non-linearities in the power vs. AGC response curve for the power amplification block 204 and the power management block 206. The compensating control block 242 also helps to improve top power calibration by delaying the onset of AGC curve saturation. Both of these results can be achieved without sacrificing power savings, and without introducing phase discontinuities as a function of operating power (which if it existed, would need to be characterized and calibrated out with baseband processing). The compensating control block 242 and corresponding method also allow for the use of slower DC-DC converters for the switched mode power supply 238, which results in efficiency gains without suffering the usual transient response penalties. The need for power can be anticipated based on the changing of the level of the supply voltage signal. Slower DC-DC converters can be used because their output can be changed ahead of time.

It should be understood that various modifications can be made to the embodiments described and illustrated herein, without departing from scope of the embodiments as defined in the appended claims.

The invention claimed is:

1. A transmitter for a mobile device comprising:
 a power amplifier for generating an amplified transmission signal;
 a detector coupled to an output of the power amplifier and configured to provide a detected amplified transmission signal; and
 a power management block comprising:
  a switching regulator control block configured to generate a switching supply control signal based on the detected amplified transmission signal; and
  a switched mode power supply coupled to the switching regulator control block and configured to generate a supply voltage signal for the power amplifier based on the switching supply control signal,
 wherein the switching regulator control block is configured to generate the switching supply control signal having control values for the switched mode power supply that cause clipping of the amplified transmission signal thereby tracking changes in the detected amplified transmission signal with lower responsivity and improving stability.

2. The transmitter of claim 1, wherein the switching regulator control block is configured to apply a switching control transfer function to the detected amplified transmission signal to generate the switching supply control signal.

3. The transmitter of claim 2, wherein poles of the switching control transfer function are derived based on a characterization of non-linear and non-time invariant effects in the detector, control curves of the switched mode power supply, and a response of the power amplifier to input drive and supply voltage.

4. The transmitter of claim 2, wherein the switching regulator control block and the switched mode power supply are included in a switching regulator control loop, and the switching control transfer function has poles located to stabilize the switching regulator control loop for gain expansion in the power amplifier.

5. The transmitter of claim 2, wherein poles of the switching control transfer function are located to stabilize the switching regulator control loop for environmental or operating conditions of the power amplifier.

6. The transmitter of claim 1, wherein the transmitter comprises:
 additional power amplifiers to form a plurality of power amplifiers; and
 at least one switch configured to couple one of the plurality of power amplifiers to the detector to provide the detected amplified transmission signal.

7. The transmitter of claim 6, wherein each of the power amplifiers of the plurality of power amplifiers is configured for a different transmission based used by the transmitter.

8. A mobile device comprising:
 a processor configured to control the operation of the mobile device;
 a transmitter coupled to the processor and configured to send and receive data, the transmitter comprising:
  a power amplifier for generating an amplified transmission signal;
  a detector coupled to an output of the power amplifier and configured to provide a detected amplified transmission signal; and
  a power management block comprising a switching regulator control block configured to generate a switching supply control signal based on the detected amplified transmission signal; and a switched mode power supply coupled to the switching regulator control block and configured to generate a supply voltage signal for the power amplifier based on the switching supply control signal,
  wherein the switching regulator control block is configured to generate the switching supply control signal having control values for the switched mode power supply that cause clipping of the amplified transmission signal thereby tracking changes in the detected amplified transmission signal with lower responsivity and improving stability.

9. The mobile device of claim 8, wherein the switching regulator control block is configured to apply a switching control transfer function to the detected amplified transmission signal to generate the switching supply control signal.

10. The mobile device of claim 9, wherein poles of the switching control transfer function are derived based on a characterization of non-linear and non-time invariant effects in the detector, control curves of the switched mode power supply, and a response of the power amplifier to input drive and supply voltage.

11. The mobile device of claim 9, wherein the switching regulator control block and the switched mode power supply are included in a switching regulator control loop, and the switching control transfer function has poles located to stabilize the switching regulator control loop for gain expansion in the power amplifier.

12. The mobile device of claim 9, wherein poles of the switching control transfer function are located to stabilize the switching regulator control loop for environmental or operating conditions of the power amplifier.

13. The mobile device of claim 8, wherein the transmitter comprises:
    additional power amplifiers to form a plurality of power amplifiers; and
    at least one switch configured to coupled one of the plurality of power amplifiers to the detector to provide the detected amplified transmission signal.

14. The mobile device of claim 13, wherein each of the power amplifiers of the plurality of power amplifiers is configured for a different transmission based used by the transmitter.

15. A method of providing a supply voltage signal to a power amplifier, the method comprising:
    generating an amplified transmission signal using the power amplifier;
    detecting an output of the power amplifier using a detector to provide a detected amplified transmission signal;
    generating a switching supply control using a switching regulator control block signal based on the detected amplified transmission signal; and
    generating the supply voltage signal by providing the switching supply control signal to a switched mode power supply;
    wherein the switching supply control signal has control values for the switched mode power supply that cause clipping of the amplified transmission signal thereby tracking changes in the detected amplified transmission signal with lower responsivity and improving stability.

16. The method of claim 15, wherein the method comprises applying a switching control transfer function to the detected amplified transmission signal to generate the switching supply control signal.

17. The method of claim 16, further comprising deriving poles of the switching control transfer function based on a characterization of non-linear and non-time invariant effects in the detector, control curves of the switched mode power supply, and a response of the power amplifier to input drive and supply voltage.

18. The method of claim 16, wherein the method comprises deriving the switching control transfer function to have poles located to stabilize a switching regulator control loop for gain expansion in the power amplifier.

19. The method of claim 16, wherein the method comprises deriving the switching control transfer function to have poles located to stabilize the switching regulator control loop for environmental or operating conditions of the power amplifier.

20. The method of claim 15, wherein there are additional power amplifiers to form a plurality of power amplifiers and the method further comprises coupling one of the plurality of power amplifiers to the detector to provide the detected amplified transmission signal, wherein each of the additional power amplifiers of the plurality of power amplifiers is configured for a different transmission band.

* * * * *